(12) United States Patent
Ryu et al.

(10) Patent No.: US 10,454,489 B2
(45) Date of Patent: Oct. 22, 2019

(54) ELECTRONIC CIRCUIT ADJUSTING TIMING OF CLOCK BASED ON BITS OF OUTPUT DATA FROM SUB-RANGING ANALOG-TO-DIGITAL CONVERTER

(71) Applicant: KOREA ADVANCED INSTITUTE OF SCIENCE AND TECHNOLOGY, Daejeon (KR)

(72) Inventors: Seung-Tak Ryu, Daejeon (KR); Dongjin Chang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/194,824

(22) Filed: Nov. 19, 2018

(65) Prior Publication Data
US 2019/0222220 A1    Jul. 18, 2019

(30) Foreign Application Priority Data
Jan. 15, 2018 (KR) .......... 10-2018-0005264

(51) Int. Cl.
| | |
|---|---|
| *H03M 1/10* | (2006.01) |
| *H03M 1/08* | (2006.01) |
| *H03M 1/12* | (2006.01) |
| *H03M 1/00* | (2006.01) |
| *H03M 1/06* | (2006.01) |

(52) U.S. Cl.
CPC ....... *H03M 1/1023* (2013.01); *H03M 1/0836* (2013.01); *H03M 1/00* (2013.01); *H03M 1/06* (2013.01); *H03M 1/10* (2013.01); *H03M 1/12* (2013.01)

(58) Field of Classification Search
CPC ............ H03M 1/10; H03M 1/06; H03M 1/12; H03M 1/00
USPC .......................... 341/120, 118, 121, 155, 156
See application file for complete search history.

(56) References Cited

U.S. PATENT DOCUMENTS

| | | | |
|---|---|---|---|
| 9,608,652 B2 | 3/2017 | Lee et al. | |
| 2015/0136971 A1* | 5/2015 | Green | H01J 49/0009 250/282 |

OTHER PUBLICATIONS

Kang, Hyun-Wook et al., "A Sign-equality-based Background Timing Mismatch Calibration Algorithm, for Time_interleaved ADCs", IEEE, vol. 63, No. 14759, pp. 1-5, Jun. 2016.

(Continued)

*Primary Examiner* — Joseph J Lauture
(74) *Attorney, Agent, or Firm* — Harness, Dickey & Pierce, P.L.C.

(57) ABSTRACT

An electronic circuit includes a reference ADC, a delay circuit, and a main ADC. The reference ADC converts an input signal to an upper bit string of output data, in response to a reference clock. The delay circuit delays a source clock by a delay time to output a main clock. The main ADC converts the input signal to a lower bit string of the output data, in response to the main clock. When a value of the most significant bit included in the lower bit string is identical to a value of the bit which is adjacent to the most significant bit and lower than the most significant bit, the delay time is adjusted based on a direction in which a level of the input signal is changed and the value of the most significant bit of the lower bit string.

20 Claims, 21 Drawing Sheets

(56) References Cited

OTHER PUBLICATIONS

Tai, Hung-Yen et al., "A 0.85fJ/conversion-step 10b 200kS/s Subranging SAR ADC in 40nm CMOS", 2014 IEEE International Solid-State Circuits Conference, pp. 196-197, Feb. 11, 2014.

Lee, Sunghyuk et al., "A 1 GS/s 10b 18.9 mW Time-Interleaved SAR ADC With Background Timing Skew Calibration", IEEE Journal of Solid-State Circuits, vol. 49, No. 12, pp. 2846-2856, Dec. 2014.

* cited by examiner

| Slope | Sign of Level Error | Sign of Timing Error | Delay Calibration |
|---|---|---|---|
| + | + | + | Increase |
| + | − | − | Decrease |
| − | + | − | Decrease |
| − | − | + | Increase |

ELECTRONIC CIRCUIT ADJUSTING TIMING OF CLOCK BASED ON BITS OF OUTPUT DATA FROM SUB-RANGING ANALOG-TO-DIGITAL CONVERTER

CROSS-REFERENCE TO RELATED APPLICATION

This U.S. non-provisional patent application claims priority under 35 U.S.C. § 119 to Korean Patent Application No. 10-2018-0005264, filed on Jan. 15, 2018, in Korean Intellectual Patent Office, the disclosure of which is incorporated herein by reference in its entirety.

FIELD

The present disclosure relates to an electronic circuit, and more particularly, relates to configurations and operations for handling a clock that is associated with an operation of the electronic circuit.

DESCRIPTION OF RELATED ART

Recently, various types of electronic devices are widely being used. An electronic device provides its own function(s) depending on operations of various electronic circuits included in the electronic device. The electronic device may operate alone, or may operate while communicating with another electronic device. The electronic device may include a communication circuit (e.g., a transmission circuit, a reception circuit, and/or the like) for communicating with another electronic device.

Communication between electronic devices may be performed as transmitting and receiving analog signals. On the other hand, most of the electronic devices may operate based on digital data. Accordingly, most of the electronic devices may include an analog-to-digital converter (ADC) to convert the analog signals to the digital data.

Including the communication circuit and the ADC, various electronic circuits may operate in response to a clock. If these electronic circuits do not receive a suitable clock, errors may occur in operations of the electronic circuits or the electronic circuits may operate improperly. This may cause an error in an operation of an electronic device including the electronic circuits. Therefore, it is important to accurately control the clock.

Meanwhile, a circuit design employing a plurality of clocks is being researched to increase communication speed and to process a large amount of data quickly. The plurality of clocks may allow a plurality of electronic circuits to operate in parallel or simultaneously (or concurrently), and thus may allow higher performance than a circuit design employing a single clock. However, when an issue (such as skew mismatch, a timing error, and/or the like) occurs in the plurality of clocks, an error may occur in the operations of the electronic circuits or performance of the electronic device may not satisfy the requirements.

SUMMARY

The present disclosure may provide configurations and operations of an electronic circuit for accurately controlling a plurality of clocks. In some example embodiments, the electronic circuit may adjust (e.g., calibrate) a delay time for a clock, to resolve a timing error of the clock. In some example embodiments, the electronic circuit may align timings of the plurality of clocks to resolve skew mismatch between the plurality of clocks.

In some example embodiments, an electronic circuit may include a reference ADC, a delay circuit, and a main ADC. The reference ADC may convert an input signal to a first bit string of output data, in response to a reference clock. The delay circuit may delay a source clock by a delay time to output a main clock. The main ADC may convert the input signal to a second bit string of the output data, in response to the main clock. When a value of a first bit included in the second bit string is identical to a value of a second bit included in the second bit string, the delay time may be adjusted based on a direction in which a level of the input signal is changed and the value of the first bit. For example, when a timing of the reference clock is different from a timing of the main clock, the value of the first bit may be identical to the value of the second bit.

For example, the first bit string may include upper bits of the output data, and the second bit string may include lower bits of the output data. For example, the first bit may include the most significant bit of the second bit string, and the second bit may include a lower bit which is adjacent to the most significant bit of the second bit string. As the delay time is adjusted, the timing of the main clock may be adjusted to be identical to the timing of the reference clock.

In some example embodiments, an electronic circuit may include a reference ADC, a plurality of delay circuits, and a plurality of main ADCs. The reference ADC may convert an input signal to first bit strings of a plurality of output data, in response to a reference clock. The plurality of delay circuits may delay a source clock by different delay times to output a plurality of main clocks providing different timings. The plurality of main ADCs may convert the input signal to second bit strings of the plurality of output data, in response to the plurality of main clocks. When a value of a first bit included in one second bit string among the second bit strings is identical to a value of a second bit included in the one second bit string, a timing of a main clock associated with output data corresponding to the one second bit string may be adjusted based on a direction in which a level of the input signal is changed and the value of the first bit.

For example, the plurality of main clocks may be time-interleaved such that the input signal is successively sampled at each of the different timings, and a timing of the reference clock may correspond to a timing of a different main clock for each cycle of the reference clock. The different timings of the plurality of main clocks may be adjusted independently.

In some example embodiments, an electronic circuit may include a plurality of auxiliary ADCs and a plurality of main ADCs. The plurality of auxiliary ADCs may convert an input signal to first bit strings of a plurality of output data, in response to a plurality of auxiliary clocks providing different first timings. The plurality of main ADCs may convert the input signal to second bit strings of the plurality of output data, in response to a plurality of main clocks providing different second timings. When a value of a first bit included in one second bit string among the second bit strings is identical to a value of a second bit included in the one second bit string, a timing of a main clock associated with output data corresponding to the one second bit string may be adjusted based on a direction in which a level of the input signal is changed and the value of the first bit.

The plurality of auxiliary clocks may be time-interleaved, and the plurality of main clocks may be time-interleaved. For each cycle of the plurality of auxiliary clocks and the plurality of main clocks, a timing of a different auxiliary clock may correspond to a timing of a different main clock.

For example, as the different second timings of the plurality of main clocks are adjusted, the different second timings of the plurality of main clocks may be aligned to be identical to first timings for one auxiliary ADC selected as a reference ADC from among the plurality of auxiliary ADCs.

For example, the number of the plurality of auxiliary ADCs and the number of the plurality of main ADCs may be relatively prime. For different cycles of the plurality of auxiliary clocks and the plurality of main clocks, each of the different first timings may correspond once to each and every one of the different second timings.

According to example embodiments of the present disclosure, timing errors of a plurality of clocks may be resolved. In some example embodiments, skew mismatch between a plurality of time-interleaving clocks may be resolved. Accordingly, in a circuit design employing a plurality of clocks, the plurality of clocks may be controlled accurately. As a result, stability and reliability of an operation of an electronic circuit and an electronic device may be improved, and performance of the electronic device may satisfy requirements.

Further, example embodiments of the present disclosure may be provided in real-time (e.g., as a background operation) during an operation of the electronic circuit. Accordingly, timings and skew for a plurality of clocks may be controlled even while the electronic device is operating.

BRIEF DESCRIPTION OF THE DRAWINGS

The above and other objects and features of the present disclosure will become apparent from the following descriptions with reference to the accompanying figures.

DETAILED DESCRIPTION

The above-mentioned features and the following detailed descriptions illustrate example embodiments to facilitate better understanding of the present disclosure. The present disclosure is not limited to these example embodiments, but may be implemented in other different aspects. The following example embodiments are merely examples for fully disclosing the present disclosure, and are merely illustrative for conveying the present disclosure to those skilled in the art to which the present disclosure belongs. Therefore, if there are several methods to implement the present disclosure, it is to be possible to implement the present disclosure in any of these methods or any equivalent thereof.

In the following descriptions, when a component is referred to as including a specific component(s) or when a process is referred to as including a specific operation(s), other component(s) or other operation(s) may be further included. The terms used in the following descriptions are provided only to illustrate specific example embodiments, and are not intended to limit the present disclosure. Illustrative examples to facilitate better understanding may also include their complementary example embodiments.

The terms used in the following descriptions may have meanings that are readily understood by those skilled in the art. Commonly used terms should be interpreted consistently in the context of the descriptions. Furthermore, the terms used in the following descriptions should not be interpreted as having excessively ideal or formal meanings, unless their meanings are specifically defined. Hereinafter, some example embodiments will be described with reference to the accompanying drawings.

Figure 1:
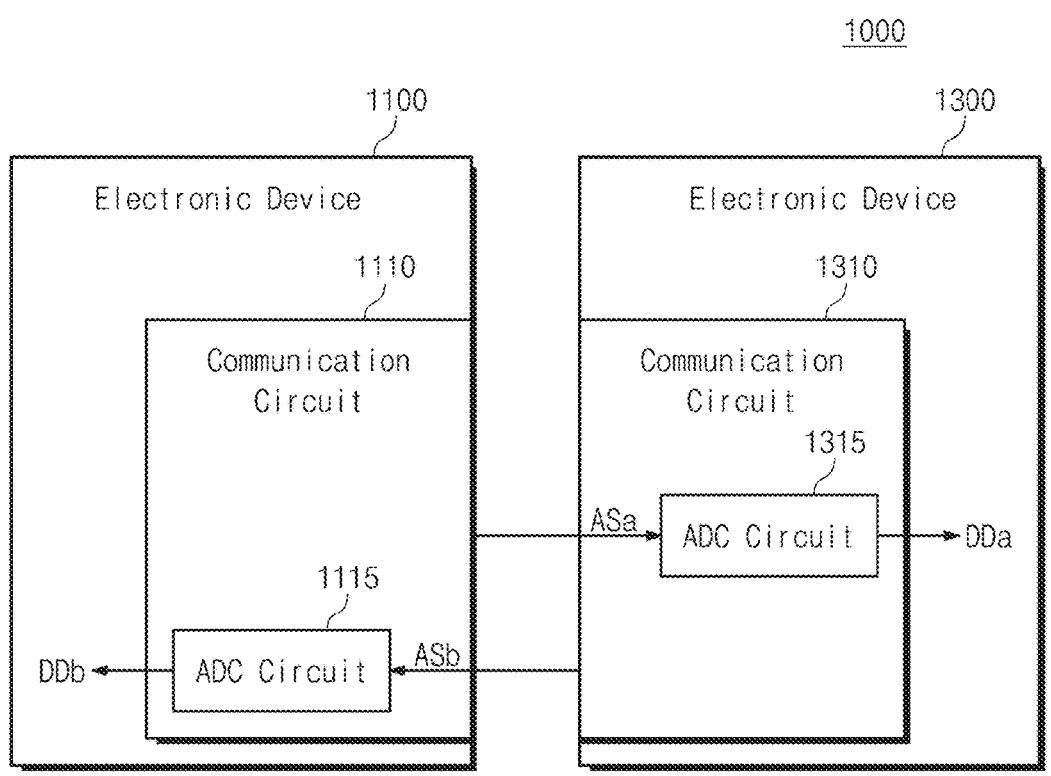
FIG. 1 is a block diagram of an electronic system including an example connection between an electronic device employing an ADC circuit according to some example embodiments and another electronic device.

FIG. 1 is a block diagram of an electronic system 1000 including an example connection between an electronic device 1300 employing an analog-to-digital converter (ADC) circuit 1315 according to some example embodiments and another electronic device 1100.

The electronic devices 1100 and 1300 may be various kinds of electronic devices. For example, each of the electronic devices 1100 and 1300 may be one of a desktop computer, a laptop computer, a tablet computer, a smart phone, a wearable device, an electric vehicle, a workstation, a server system, and/or the like. The present disclosure is not limited to these examples, and the electronic devices 1100 and 1300 may be implemented with any kind of electronic devices capable of communicating with each other.

The electronic device 1300 may communicate with the electronic device 1100. To this end, the electronic device 1300 may include a communication circuit 1310, and the electronic device 1100 may include a communication circuit 1110. Each of the communication circuits 1110 and 1310 may include various hardware circuits (e.g., an antenna, an amplification circuit, a modulation/demodulation circuit, an encoder/decoder circuit, a clock and data recovery (CDR), and/or the like) for facilitating communication between the electronic devices 1100 and 1300.

The communication circuits 1110 and 1310 may operate and be configured in compliance with one or more of a variety of communication protocols. The communication circuits 1110 and 1310 may support at least one of various wired communication protocols such as transfer control protocol/Internet protocol (TCP/IP), universal serial bus (USB), Firewire, and the like and/or at least one of various wireless communication protocols such as long term evolution (LTE), worldwide interoperability for microwave access (WIMAX), global system for mobile communications (GSM), code division multiple access (CDMA), Bluetooth, wireless fidelity (Wi-Fi), radio frequency identification (RFID), and the like.

The electronic device 1100 may transmit an analog signal ASa to the electronic device 1300 to communicate with the electronic device 1300. The communication circuit 1310 may receive the analog signal ASa from the electronic device 1100. The electronic device 1300 may transmit an analog signal ASb to the electronic device 1100 to communicate with the electronic device 1100. The communication circuit 1110 may receive the analog signal ASb from the electronic device 1300. Communication between the electronic devices 1100 and 1300 may be performed as the electronic devices 1100 and 1300 transmit and receive the analog signals ASa and ASb.

Meanwhile, the electronic device 1300 may operate based on digital data DDa which is obtained from the analog signal ASa, and the electronic device 1100 may operate based on digital data DDb which is obtained from the analog signal ASb. Accordingly, the communication circuit 1310 may include the ADC circuit 1315 to convert the analog signal ASa to the digital data DDa, and the communication circuit 1110 may include an ADC circuit 1115 to convert the analog signal ASb to the digital data DDb.

The digital data DDa converted by the ADC circuit 1315 may be provided to other component(s) included in the electronic device 1300, and the electronic device 1300 may provide its own function(s) based on the digital data DDa. The digital data DDb converted by the ADC circuit 1115 may be provided to other component(s) included in the electronic device 1100, and the electronic device 1100 may provide its own function(s) based on the digital data DDb.

Figure 2:
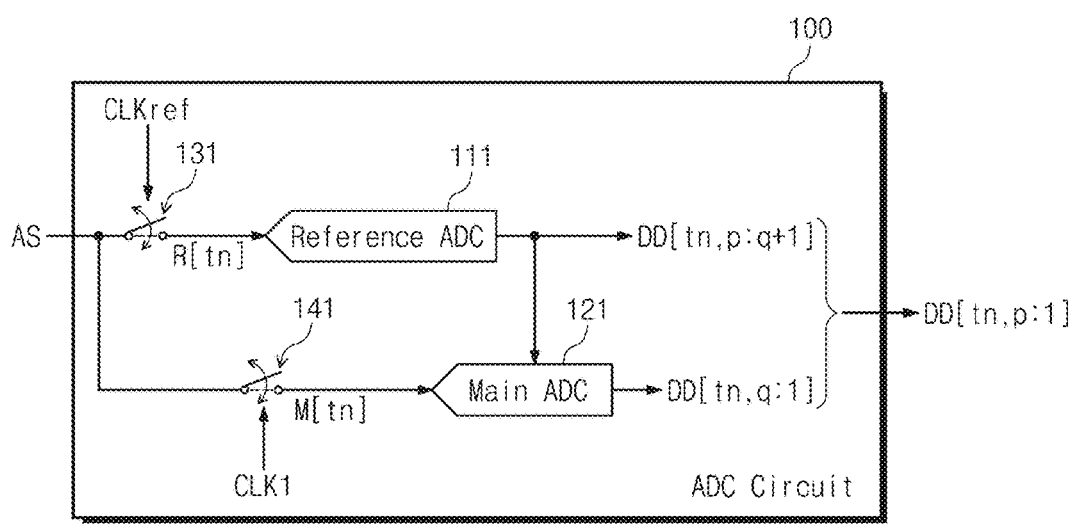
FIG. 2 is a block diagram illustrating an example configuration of an ADC circuit of FIG. 1.

FIG. 2 is a block diagram illustrating an example configuration of the ADC circuit 1115 or 1315 of FIG. 1. In some example embodiments, at least one of the ADC circuits 1115 and 1315 of FIG. 1 may include an ADC circuit 100 of FIG. 2.

The ADC circuit 100 may be implemented in an electronic circuit configured to perform operations described above and to be described below. The ADC circuit 100 may include various analog/digital circuits to perform the operations described above and to be described below.

The ADC circuit 100 may receive an input signal (e.g., an analog signal AS). The ADC circuit 100 may convert the input signal to output data DD[tn, p:1]. The ADC circuit 100 may sample the input signal at each of a plurality of timings, and the output data DD[tn, p:1] may be converted from the input signal that is sampled with regard to a timing tn. For example, the output data DD[tn, p:1] may include p bits.

In some example embodiments, the ADC circuit 100 may include a reference ADC 111 and a main ADC 121. Each of the reference ADC 111 and the main ADC 121 may receive the input signal (e.g., the analog signal AS). The reference ADC 111 may convert the input signal to a first bit string DD[tn, p:q+1] of the output data DD[tn, p:1]. The main ADC 121 may convert the input signal to a second bit string DD[tn, q:1] of the output data DD[tn, p:1].

For example, the second bit string DD[tn, q:1] may include q bits included in the output data DD[tn, p:1], and the first bit string DD[tn, p:q+1] may include remaining (p-q) bits included in the output data DD[tn, p:1]. That is, each of the reference ADC 111 and the main ADC 121 may generate a portion of the output data DD[tn, p:1]. For example, the first bit string DD[tn, p:q+1] may include upper bits of the output data DD[tn, p:1], and the second bit string DD[tn, q:1] may include lower bits of the output data DD[tn, p:1].

The output data DD[tn, p:1] may be generated by combining the first bit string DD[tn, p:q+1] and the second bit string DD[tn, q:1] respectively generated from the reference ADC 111 and the main ADC 121. The output data DD[tn, p:1] may be handled as digital data DD in an electronic device including the ADC circuit 100.

The ADC circuit 100 may separately generate different bits of the output data DD[tn, p:1] by using the ADCs 111 and 121. For example, the ADC circuit 100 may be understood as a sub-ranging ADC. For example, the reference ADC 111 may be understood as a coarse ADC for providing the upper bits of the output data DD[tn, p:1], and the main ADC 121 may be understood as a fine ADC for providing the lower bits of the output data DD[tn, p:1].

The reference ADC 111 and the main ADC 121 may be implemented with various types of ADCs to convert the analog signal AS to the output data DD[tn, p:1]. For example, each of the reference ADC 111 and the main ADC 121 may be implemented with one of various types of ADCs such as a successive approximation register (SAR) ADC, a dual slope integration (DSI) ADC, a flash ADC, a delta-sigma modulation (DSM) ADC, and/or the like, but the present disclosure is not limited to these examples. The reference ADC 111 and the main ADC 121 may be implemented with the same type of ADC or with different types of ADCs.

The ADC circuit 100 may include switches 131 and 141 that correspond to the ADCs 111 and 121 respectively. The switch 131 may switch connection to the reference ADC 111 such that the input signal (e.g., the analog signal AS) is provided to the reference ADC 111 or not provided. The switch 141 may switch connection to the main ADC 121 such that the input signal is provided to the main ADC 121 or not provided.

When the switches 131 and 141 are connected, the input signal may be provided to the ADCs 111 and 121. On the other hand, when the switches 131 and 141 are disconnected, the input signal may not be provided to the ADCs 111 and 121.

When the input signal is provided to the reference ADC 111 and the main ADC 121, the reference ADC 111 and the main ADC 121 may convert the input signal to the first bit string DD[tn, p:q+1] and the second bit string DD[tn, q:1] respectively. Therefore, the ADC circuit 100 may output the output data DD[tn, p:1].

FIG. 2 illustrates that each of the switches 131 and 141 is a switch element, but the present disclosure is not limited to that illustrated in FIG. 2. Each of the switches 131 and 141 may be implemented with any element capable of switching connection, such as a transistor, a capacitor, a gate circuit, and/or the like.

The ADC circuit 100 may employ a plurality of clocks for the ADCs 111 and 121. For example, the reference clock CLKref and the main clock CLK1 may be employed for the reference ADC 111 and the main ADC 121 respectively. The switches 111 and 121 may switch the connections in response to the reference clock CLKref and the main clock CLK1 respectively. Each of the reference clock CLKref and the main clock CLK1 may be provided from a separate clock generator, or may be provided from a clock which is recovered from the input signal (e.g., the analog signal AS) by a separate CDR circuit.

As the switches 111 and 121 operate in response to the reference clock CLKref and the main clock CLK1, the reference ADC 111 and the main ADC 121 may operate in response to the reference clock CLKref and the main clock CLK1 respectively. The reference ADC 111 and the main ADC 121 may respectively convert the input signal to the first bit string DD[tn, p:q+1] and the second bit string DD[tn, q:1] in parallel, in response independently to the reference clock CLKref and the main clock CLK1.

For example, the reference ADC 111 may be configured to provide fast conversion performance, and the main ADC 121 may be configured to provide precise conversion capability. As the reference ADC 111 quickly generates the first bit string DD[tn, p:q+1] and the main ADC 121 generates the second bit string DD[tn, q:1], the overall performance and reliability of the ADC circuit 100 may be improved. However, this example is provided to facilitate better understanding, and is not intended to limit the present disclosure.

For example, at the timing tn of the reference clock CLKref, the reference ADC 111 may obtain a sample R[tn] from the input signal (e.g., the analog signal AS). Further, at the timing tn of the main clock CLK1, the main ADC 121 may obtain a sample M[tn] from the input signal. Each of the samples R[tn] and M[tn] may have a level of the input signal at the timing tn. For example, the level of the signal may mean a voltage level, but the present disclosure is not limited to this example.

The reference ADC 111 may output the first bit string DD[tn, p:q+1] based on the sample R[tn]. Meanwhile, the first bit string DD[tn, p:q+1] may include only a portion of bits of the output data DD[tn, p:1], and thus may not sufficiently represent the sample R[tn]. Due to this respect, referring to the following Equation 1, there may be a quantization error between the sample R[tn] and the first bit string DD[tn, p:q+1].

$$Q[tn] = R[tn] - DD[tn, p:q+1]$$ [Equation 1]

(where Q[tn] denotes a quantization error of the reference ADC 111 at the timing tn)

The above Equation 1 describes a subtraction operation between the sample R[tn] and the first bit string DD[tn, p:q+1]. However, the subtraction operation of the above Equation 1 is provided to describe a concept of the quantization error Q[tn], and may not mean a general arithmetic operation. Operations referred to in other equations below should also be understood as conceptual descriptions.

Meanwhile, the second bit string DD[tn, q:1] generated by the main ADC 121 may include remaining bits other than the bits included in the first bit string DD[tn, p:q+1]. Thus, it may be understood that the main ADC 121 compensates for the quantization error Q[tn] which is not processed in the reference ADC 111.

To this end, the main ADC 121 may generate the second bit string DD[tn, q:1] based on the sample M[tn] and the first bit string DD[tn, p:q+1]. For example, the main ADC 121 may convert a value corresponding to a difference between the sample M[tn] and the first bit string DD[tn, p:q+1] to the second bit string DD[tn, q:1]).

Under an ideal condition, the reference clock CLKref and the main clock CLK1 may provide the same timing tn, and the reference ADC 111 and the main ADC 121 may sample the input signal (e.g., the analog signal AS) at the same timing tn. Thus, under the ideal condition, the sample R[tn] may be the same as the sample M[tn]. As a result, referring to the following Equation 2, the second bit string DD[tn, q:1] may be understood as being based on a difference between the sample R[tn] and the first bit string DD[tn, p:q+1], and may be generated to compensate for the quantization error Q[tn] in the above Equation 1.

[Equation 2]

$$DD[tn, q:1] + QF[tn] = M[tn] - DD[tn, p:q+1]$$ [Equation 2]
$$= R[tn] - DD[tn, p:q+1]$$
$$= Q[tn]$$

(where QF[tn] represents an quantization error of the main ADC 121 at the timing tn)

Figure 3:
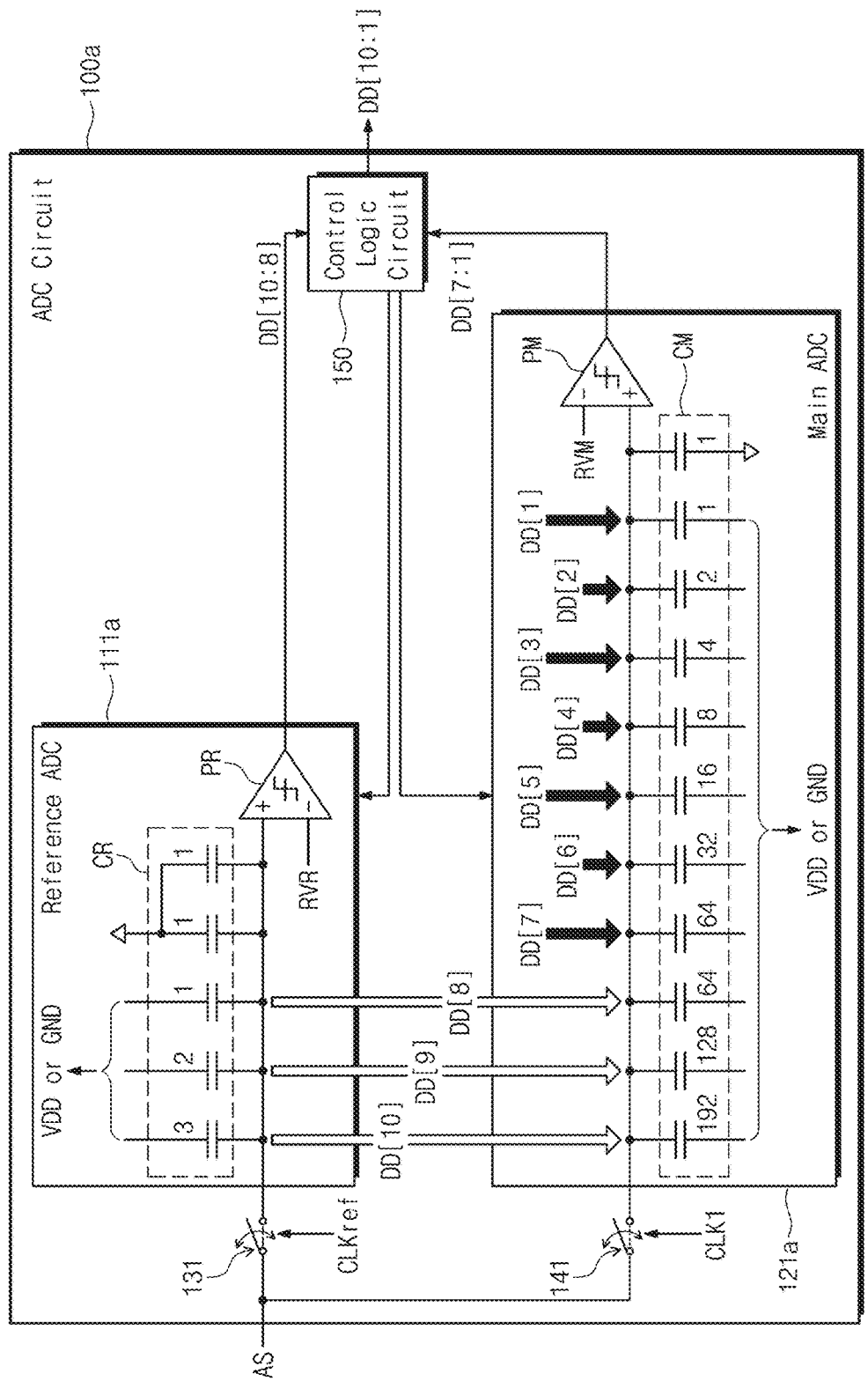
FIG. 3 is a block diagram illustrating an example configuration of an ADC circuit of FIG. 2.

FIG. 3 is a block diagram illustrating an example configuration of the ADC circuit 100 of FIG. 2. In some example embodiments, the ADC circuit 100 may include an ADC circuit 100a of FIG. 3.

The ADC circuit 100a may include a reference ADC 111a, a main ADC 121a, the switches 131 and 141, and a control logic circuit 150. The reference ADC 111a and the main ADC 121a may correspond to the reference ADC 111 and the main ADC 121 of FIG. 2 respectively. FIG. 3 illustrates an example in which the ADC circuit 100a outputs 10-bit output data DD[10:1] as the reference ADC 111a converts the input signal (e.g., the analog signal AS) to a first bit string DD[10:8] of 3 bits and the main ADC 121a converts the input signal to a second bit string DD[7:1] of 7 bits.

In some example embodiments, each of the reference ADC 111a and the main ADC 121a may be implemented with an SAR ADC. In such example embodiments, the reference ADC 111a may include capacitors CR and a comparator PR, and the main ADC 121a may include capacitors CM and a comparator PM. The numbers next to the capacitors CR and CM may mean a ratio of capacitance values of the respective capacitors.

The configuration of FIG. 3 is provided as an example, and is not intended to limit the present disclosure. In particular, the reference ADC 111a may be implemented with another type of ADC. However, in the following descriptions, to facilitate better understanding, examples in which each of the reference ADC 111a and the main ADC 121a is implemented with an SAR ADC will be described.

A non-inverting terminal of the comparator PR may receive the input signal (e.g., the analog signal AS) through the switch 131 in response to the reference clock CLKref. Thus, a voltage of the non-inverting terminal of the comparator PR may correspond to a level of the input signal. First ends of the capacitors CR may be connected to the non-inverting terminal of the comparator PR. Further, a reference level RVR may be provided to an inverting terminal of the comparator PR. In some example embodiments, the reference ADC 111a may employ a differential scheme instead of employing the reference level RVR.

The comparator PR may output a result of comparing the level of the input signal with the reference level RVR. The output of the comparator PR may provide the first bit string DD[10:8]. The control logic circuit 150 may control the reference ADC 111a based on each bit included in the first bit string DD[10:8]. Depending on the control of the control logic circuit 150, some of second ends of the capacitors CR may be selectively connected to a driving voltage VDD or a ground voltage GND. The reference level RVR, the driving voltage VDD, and the ground voltage GND may be provided from a separate voltage generator or voltage converter.

As some of the capacitors CR are connected to the driving voltage VDD or the ground voltage GND in the order of capacitor having a larger capacitance value, the level of the input signal may be compared with the reference level RVR. Depending on whether some of the capacitors CR are connected to the driving voltage VDD or the ground voltage GND, the bits of the first bit string DD[10:8] may be determined.

For example, depending on whether a capacitor having a capacitance value corresponding to "3" is connected to the driving voltage VDD or the ground voltage GND, the bit DD[10] may be determined. Such operations of the SAR ADC may be readily understood, and thus detailed descriptions will be omitted below.

A non-inverting terminal of the comparator PM may receive the input signal (e.g., the analog signal AS) through the switch 141 in response to the main clock CLK1. Thus, a voltage of the non-inverting terminal of the comparator PM may correspond to the level of the input signal. First ends of the capacitors CM may be connected to a non-inverting terminal of the comparator PM.

Further, a reference level RVM may be provided to an inverting terminal of the comparator PM. The reference level RVM may be provided from a separate voltage generator or voltage converter. In some example embodiments, the main ADC 121a may employ a differential scheme instead of employing a reference level RVM.

The comparator PM may output a result of comparing the level of the input signal with the reference level RVM. The output of the comparator PM may provide the second bit string DD[7:1]. The control logic circuit 150 may control the main ADC 121a based on each bit included in the second bit string DD[7:1]. Depending on the control of the control logic circuit 150, some of second ends of the capacitors CM may be selectively connected to the driving voltage VDD or the ground voltage GND.

First, under the control of the control logic circuit 150, the main ADC 121a may refer to the first bit string DD[10:8] generated from the reference ADC 111a, instead of directly generating the first bit string DD[10:8]. Thus, second ends of capacitors CM, among the capacitors CM, associated with upper bits may be connected to the driving voltage VDD or the ground voltage GND based on the bits of the first bit string DD[10:8].

Then, as some of the capacitors CM are connected to the driving voltage VDD or the ground voltage GND in the order of capacitor having a larger capacitance value, the level of the input signal may be compared with the reference level RVM. Depending on whether some of the capacitors CM are connected to the driving voltage VDD or the ground voltage GND, the bits of the second bit string DD[7:1] may be determined.

Under the control of the control logic circuit 150, the output data DD[10:1] may be output based on the first bit string DD[10:8] and the second bit string DD[7:1]. Such operations of the SAR ADC may be readily understood, and thus detailed descriptions will be omitted below. However, to facilitate better understanding, some examples will be described with reference to FIGS. 4 and 5.

Figure 4:
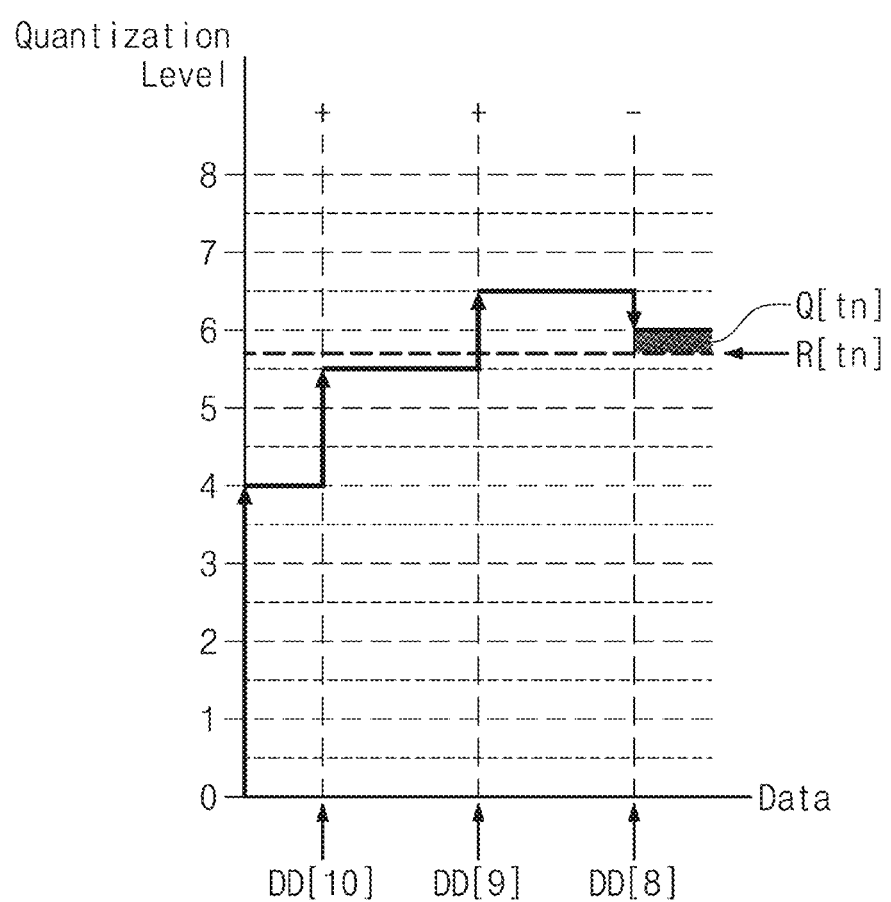
FIGS. 4 and 5 are graphs for describing an example operation of an ADC circuit of FIG. 2.
Figure 5:
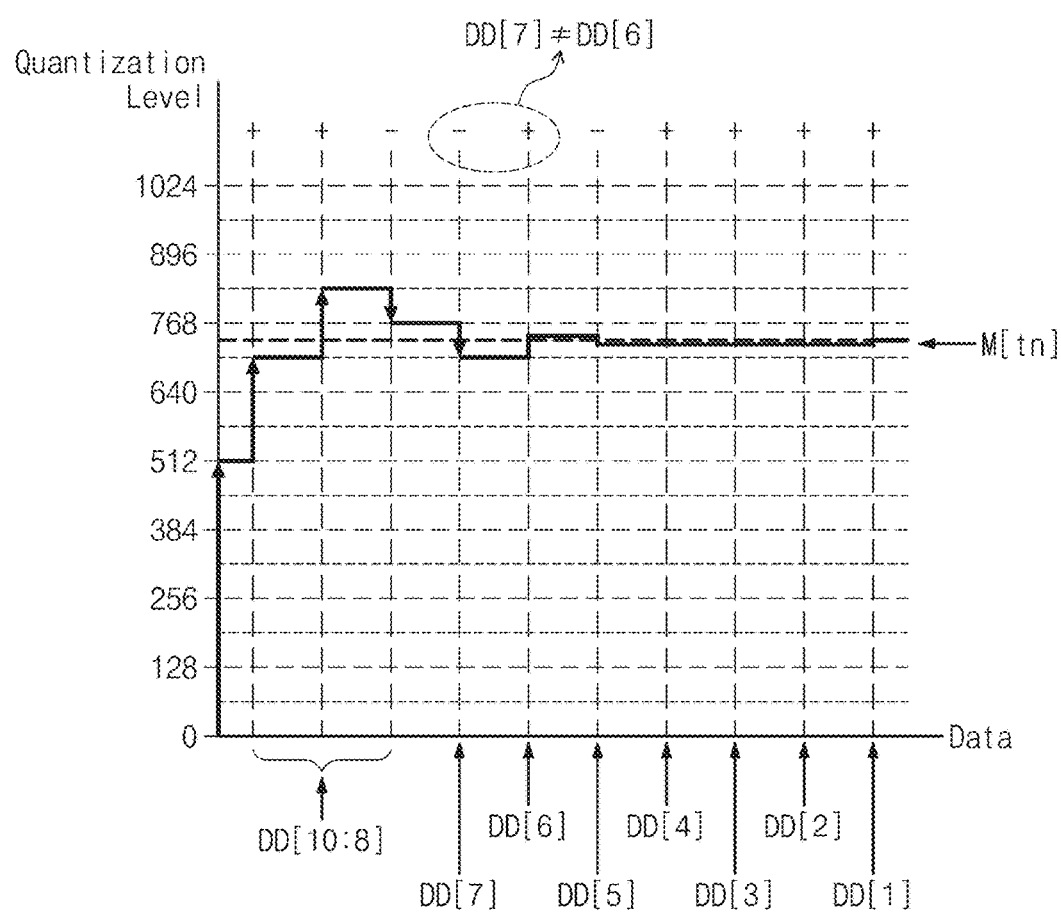

FIGS. 4 and 5 are graphs for describing an example operation of the ADC circuit 100 of FIG. 2.

For example, the example operation of FIGS. 4 and 5 may be based on a successive approximation scheme, and may be associated with the ADC circuit 100a of FIG. 3. The example successive approximation scheme to be described below is associated with a non-binary search. However, it may be readily understood that the present disclosure is not limited thereto and may be applied in association with a binary search in a similar context to the following descriptions.

FIG. 4 illustrates an example procedure of generating the first bit string DD[10:8] in the reference ADC 111a of FIG. 3. When the reference ADC 111a operates with a resolution of 3 bits, the sample R[tn] may be converted to one of eight levels of quantization levels.

First, a level of the sample R[tn] may be compared with a quantization level "4" which is a median value of the eight levels of the quantization levels. In the example of FIG. 4, the level of the sample R[tn] may be greater than the quantization level "4", and the comparator PR may output a result indicating that the level of the sample R[tn] is greater than the quantization level "4". The bit DD[10] of the first bit string DD[10:8] may have a logic value (e.g., logic "1") corresponding to the output of the comparator PR.

Next, the level of the sample R[tn] may be compared with a quantization level "5.5". In the example of FIG. 4, the level of the sample R[tn] may be greater than the quantization level "5.5", and the comparator PR may output a result indicating that the level of the sample R[tn] is greater than the quantization level "5.5". The bit DD[9] of the first bit string DD[10:8] may have a logic value (e.g., logic "1") corresponding to the output of the comparator PR.

The reference level RVR may be suitably controlled to correspond to a compared quantization level. Each bit of the first bit string DD[10:8] may have a logic value of logic "1" or logic "0" depending on whether the level of the sample R[tn] is greater or less than the reference level RVR.

In a similar manner, the bit DD[8] of the first bit string DD[10:8] may be generated. Meanwhile, even though the first bit string DD[10:8] is generated, the quantization error Q[tn] may occur. The main ADC 121a of FIG. 3 may generate the second bit string DD[7:1] which is to compensate for the quantization error Q[tn].

FIG. 5 illustrates an example procedure of generating the second bit string DD[7:1] in the main ADC 121a. When the main ADC 121a operates with a resolution of 10 bits, the sample M[tn] may be converted to one of 1024 levels of quantization levels.

First, the first bit string DD[10:8] generated from the reference ADC 111a may be provided to the main ADC 121a. Accordingly, some of the capacitors CM may be selectively connected to the driving voltage VDD or the ground voltage GND based on the first bit string DD[10:8], and an initial state for comparing a level of the sample M[tn] with the reference level RVM may be set in the main ADC 121a.

Afterwards, the level of the sample M[tn] may be compared with the reference level RVM in a manner similar to that for generating the first bit string DD[10:8], and the bits DD[7] to DD[1] of the second bit string DD[7:1] may be determined based on the comparison results. Therefore, the input signal may be converted to the output data DD[10:1].

Meanwhile, the most significant bit DD[7] of the second bit string DD[7:1] may be generated with regard to a capacitor having a capacitance value corresponding to "64" of FIG. 3. In some example embodiments, this capacitor with the capacitance value corresponding to "64" may provide a redundancy interval of quantization levels, and the most significant bit DD[7] of the second bit string DD[7:1] may be understood as a redundancy bit in the SAR ADC of a sub-ranging structure. The redundancy bit may improve accuracy of conversion of the SAR ADC.

Due to a characteristic of the successive approximation scheme that provides analog-to-digital conversion as approaching the sampled level of the input signal, the most significant bit DD[7] of the second bit string DD[7:1] output from the main ADC 121a may be different from the lower bit DD[6] adjacent to the most significant bit DD[7]. When the sample M[tn] is obtained identically to the sample R[tn] under the ideal condition, a comparison result corresponding to the most significant bit DD[7] of the second bit string DD[7:1] may be opposite to a comparison result corresponding to the lower bit DD[6].

From this perspective, when the most significant bit DD[7] of the second bit string DD[7:1] is identical to its lower bit DD[6] (i.e., when the comparison result corresponding to the most significant bit DD[7]) of the second bit string DD[7:1] is identical to the comparison result corresponding to the lower bit DD[6]), it may be understood that the sample M[tn] is different from the sample R[tn]. This may mean that the samples R[tn] and M[tn] are not obtained at the same timing tn and there is a timing error, as will be described with reference to FIGS. 6 and 7.

Figure 6:
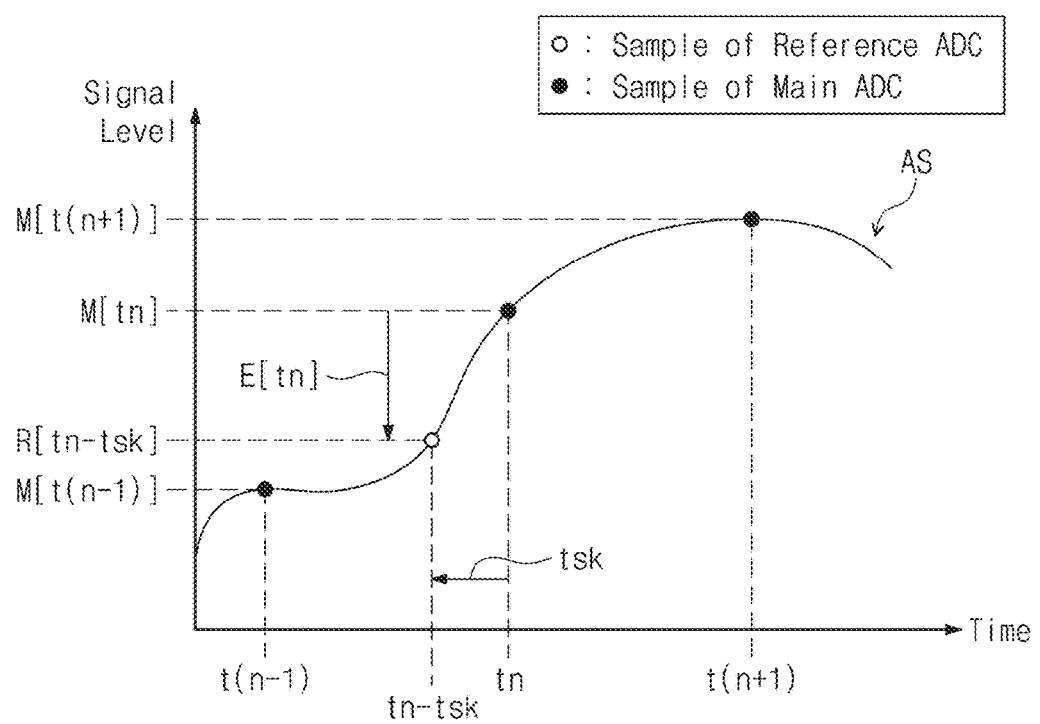
FIG. 6 is a timing diagram illustrating example timings of clocks handled in an ADC circuit of FIG. 2.
Figure 7:
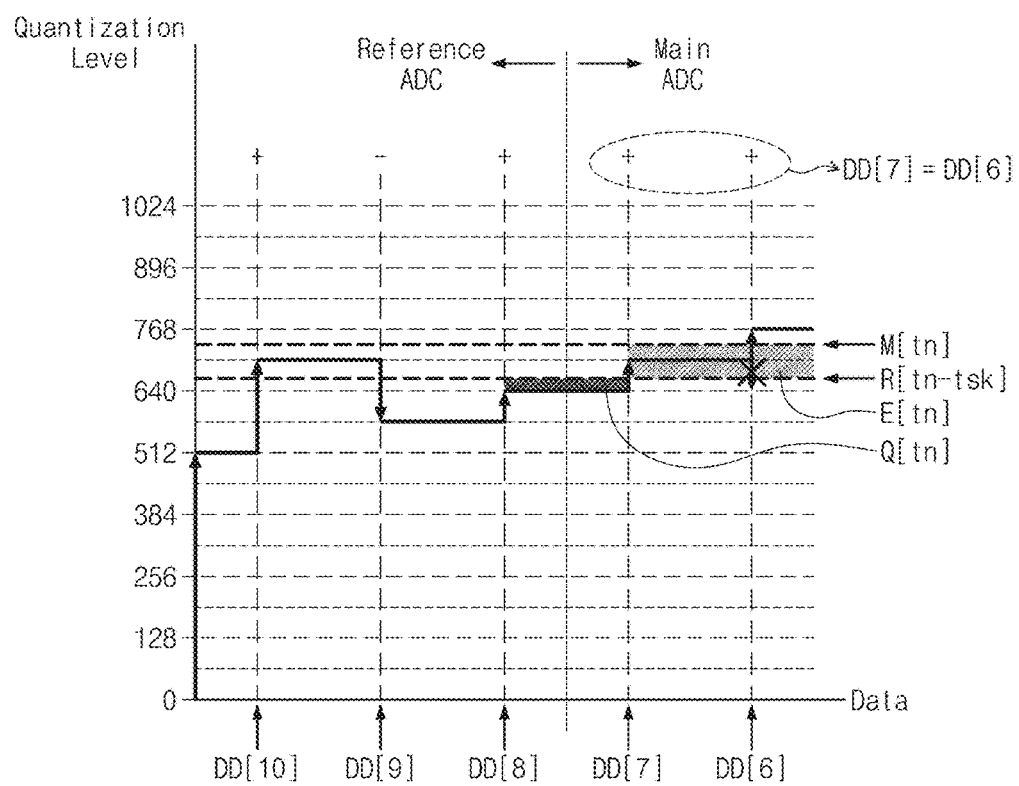
FIG. 7 is a graph for describing an example operation of an ADC circuit of FIG. 2 with regard to timings of FIG. 6.

FIG. 6 is a timing diagram illustrating example timings of the clocks handled in the ADC circuit 100 of FIG. 2. FIG. 7 is a graph for describing an example operation of the ADC circuit 100 of FIG. 2 with regard to the timings of FIG. 6.

Referring to FIG. 6, the main ADC 121 may sample the input signal (e.g., the analog signal AS) at each of timings t(n−1), tn, and t(n+1) of the main clock CLK1. Thus, the main ADC 121 may obtain samples M[t(n−1)], M[tn], and M[t(n+1)] from the input signal.

Meanwhile, under an ideal condition, the reference ADC 111 may sample the input signal at the timing tn of the reference clock CLKref. However, various factors (such as a circuit design issue (e.g., a device characteristic, a difference between physical lengths of clock lines, and/or the like), process-voltage-temperature (PVT) variation, and/or the like) may affect timings of the reference clock CLKref and/or the main clock CLK1.

For example, a timing error tsk may occur between the reference clock CLKref and the main clock CLK1. In this case, for example, the reference clock CLKref may provide a timing (tn−tsk) deviating from the timing tn, and the reference ADC 111 may obtain the sample R[tn−tsk] at the timing (tn−tsk) instead of the timing tn.

As the sample R[tn−tsk] is obtained instead of the sample R[tn], a level error E[tn] may occur between a level of the sample M[tn] of the main ADC 121 and a level of the sample R[tn−tsk] of the reference ADC 111. The level error E[tn] may occur with regard to the timing to due to the timing error tsk. The concept of the level error E[tn] may be understood from the following Equation 3.

$$E[tn] = M[tn] - R[tn-tsk] \quad \text{[Equation 3]}$$

Meanwhile, when the timing error tsk and the level error E[tn] occur, the quantization error Q[tn] of the above Equation 1 may be changed to the following Equation 4.

$$Q[tn] = R[tn-tsk] - DD[tn, p:q+1] \quad \text{[Equation 4]}$$

Taking into account the above Equations 3 and 4, the second bit string DD[tn, q:1] may be described as the following Equation 5.

[Equation 5]

$$DD[tn, q:1] + QF[tn] = M[tn] - DD[tn, p:q+1] \quad \text{[Equation 5]}$$
$$= M[tn] + Q[tn] - R[tn-tsk]$$
$$= Q[tn] + E[tn]$$

Comparing the above Equation 5 with the above Equation 2, it may be understood that the level error E[tn] affects the second bit string DD[tn, q:1]. This influence may be better understood from FIG. 7.

FIG. 7 is associated with the examples described with reference to FIGS. 3 to 5. After the reference ADC 111a generates the bits DD[10] to DD[8], the main ADC 121a may generate the bit DD[7]. Under the ideal condition, the main ADC 121a may only compensate for the quantization error Q[tn]. However, when the timing error tsk and the level error E[tn] occur, the main ADC 121a may operate to compensate for both the quantization error Q[tn] and the level error E[tn].

Taking into account the sample R[tn−tsk], the bit DD[6] may have a value corresponding to a comparison result which indicates that the level of the sample R[tn−tsk] is smaller than the reference level. However, taking into account the sample M[tn], the bit DD[6] may have a value corresponding to the comparison result which indicates that the level of the sample M[tn] is greater than the reference level. That is, the level error E[tn] may cause the bit DD[6] to have an unintended value.

Due to the level error E[tn], bits of the second bit string DD[tn, q:1] may have unintended values, and the erroneous output data DD[tn, p:1] may be generated. This may cause unstable operations of the ADC circuit 100 and the electronic device including the ADC circuit 100, and the ADC circuit 100 may become vulnerable to a noise.

Further, due to the timing error tsk, a margin of a sampling timing may become insufficient or a setup/hold time may become inadequate. In some cases, the timing error tsk may cause a noise of an unintended frequency component.

The timing error tsk and the level error E[tn] may deteriorate stability and reliability of the ADC circuit 100 and the electronic device including the ADC circuit 100, and may affect requirements such as a resolution, an error rate, a dynamic range, and/or the like. Therefore, resolving the timing error tsk and the level error E[tn] may be important issues.

Example embodiments of the present disclosure may provide configurations and operations for resolving the timing error tsk and the level error E[tn] described with reference to FIGS. 6 and 7. In regard to the examples of FIGS. 6 and 7, due to the timing error tsk and the level error E[tn], it may be understood that the most significant bit DD[7] of the second bit string DD[7:1] is identical to its lower bit DD[6]. Comparing FIG. 5 associated with the ideal condition to FIG. 7 associated with the level error E[tn], it may be understood that the most significant bit DD[7] of the second bit string DD[7:1] and the lower bit DD[6] adjacent to the most significant bit DD[7] may be referenced to resolve the timing error tsk and the level error E[tn].

Figures 8, 9:
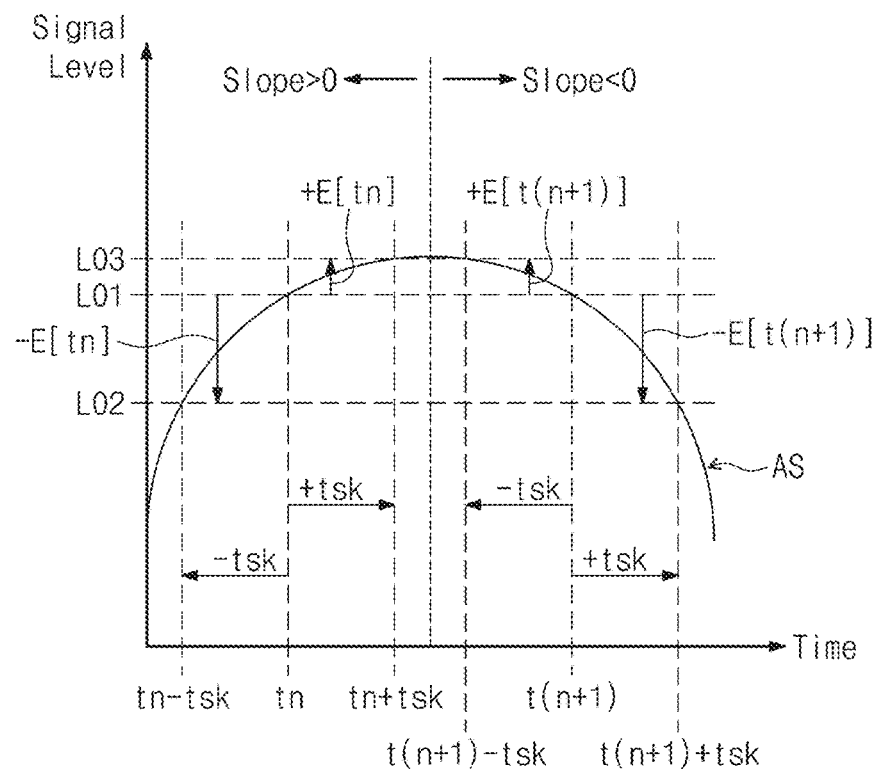
FIG. 8 is a timing diagram for describing an example method of adjusting a timing of a main clock handled in an ADC circuit of FIG. 2.
FIG. 9 is a table for describing an example method of adjusting a timing of a main clock with regard to a timing diagram of FIG. 8.

FIG. 8 is a timing diagram for describing an example method of adjusting the timing of the main clock CLK1 handled in the ADC circuit 100 of FIG. 2. FIG. 9 is a table for describing an example method of adjusting the timing of the main clock CLK1 with regard to the timing diagram of FIG. 8.

Referring to FIG. 8, the level of the input signal (e.g., the analog signal AS) may increase or decrease during a time period. Accordingly, a slope of the input signal may increase or decrease. The slope of the input signal may be associated with a direction in which the level of the input signal is changed (i.e., an increase or decrease in the level of the input signal).

For example, while the slope of the analog signal AS is positive (e.g., while the level of the input signal increases), the timing tn may be intended to sample a level L01 of the analog signal AS. However, when a negative timing error −tsk occurs, a level L02 of the analog signal AS may be sampled at the timing (tn-tsk) and a negative level error −E[tn] may occur. On the other hand, when a positive timing error +tsk occurs, a level L03 of the analog signal AS may be sampled at the timing (tn+tsk) and a positive level error +E[tn] may occur.

For example, while the slope of the analog signal AS is negative (e.g., while the level of the input signal decreases), a timing t(n+1) may be intended to sample the level L01 of the analog signal AS. However, when a negative timing error −tsk occurs, the level L03 of the analog signal AS may be sampled at the timing (t(n+1)−tsk) and the positive level error +E[t(n+1)] may occur. On the other hand, when a positive timing error +tsk occurs, the level L02 of the analog signal AS may be sampled at the timing (t(n+1)+tsk) and a negative level error −E[t(n+1)] may occur.

Referring to the above examples, it may be understood that a sign of the slope of the analog signal AS and a sign of the level error are associated with a sign of the timing error. Referring to FIG. 9, for example, when the sign of the slope of the analog signal AS is identical to the sign of the level error, this may mean that a positive timing error has occurred. On the other hand, for example, when the sign of the slope of the analog signal AS is opposite to the sign of the level error, this may mean that a negative timing error has occurred.

Example embodiments of the present disclosure may adjust the timings of the main clock CLK1 to resolve the timing error. The timings of the main clock CLK1 may be adjusted to be identical to the timings of the reference clock CLKref. In other words, the timings of the main clock CLK1 may be aligned with the timings of the reference clock CLKref. Therefore, the timing error between the main clock CLK1 and the reference clock CLKref may be resolved.

Example embodiments of the present disclosure may adjust a delay time associated with transmitting the main clock CLK1, to adjust the timings of the main clock CLK1. For example, a positive timing error may mean that the timings of the reference clock CLKref are later than the timings of the main clock CLK1. Therefore, in this case, the delay time may increase such that the timings of the main clock CLK1 are delayed. On the other hand, a negative timing error may mean that the timings of the reference clock CLKref are earlier than the timings of the main clock CLK1. Therefore, in this case, the delay time may decrease such that the timings of the main clock CLK1 are advanced.

Figure 10:
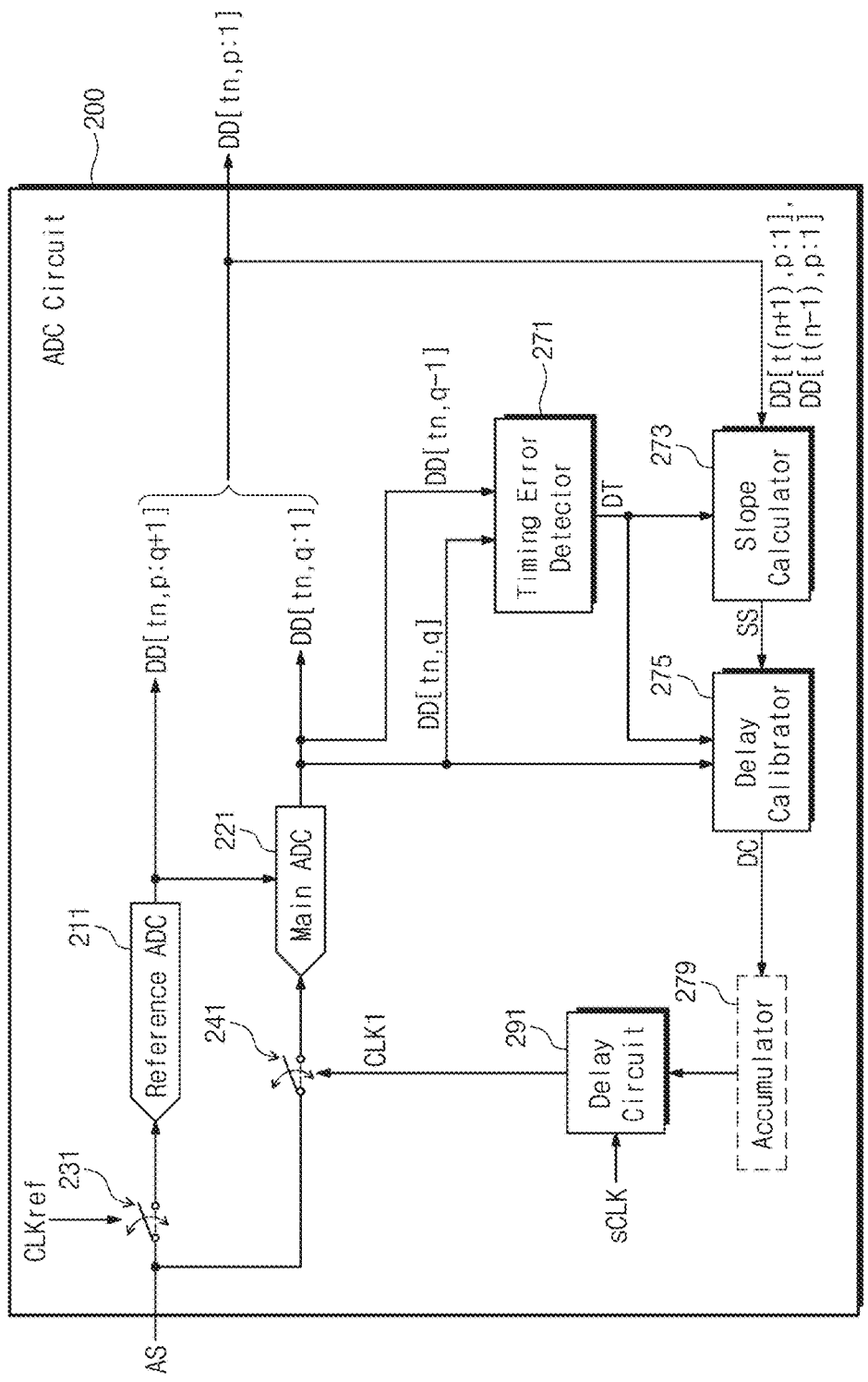
FIG. 10 is a block diagram illustrating an example configuration of an ADC circuit of FIG. 1.

FIG. 10 is a block diagram illustrating an example configuration of the ADC circuit 1115 or 1315 of FIG. 1. In some example embodiments, at least one of the ADC circuits 1115 and/or 1315 of FIG. 1 may include an ADC circuit 200 of FIG. 10.

The ADC circuit 200 may be implemented with an electronic circuit configured to perform operations to be described below. The ADC circuit 200 may include various analog/digital circuits to perform the operations to be described below.

For example, the ADC circuit 200 may include a reference ADC 211, a main ADC 221, switches 231 and 241, a timing error detector 271, a slope calculator 273, a delay calibrator 275, and a delay circuit 291. The reference ADC 211, the main ADC 221, and the switches 231 and 241 may correspond to the reference ADC 111, the main ADC 121, and the switches 131 and 141 of FIG. 2 respectively. For brevity, redundant descriptions of the reference ADC 211, the main ADC 221, and the switches 231 and 241 will be omitted below.

The timing error detector 271 may detect a timing error between the reference clock CLKref and the main clock CLK1. The timing error detector 271 may output a detection value DT based on the detection result. For example, when the timing error occurs between the reference clock CLKref and the main clock CLK1, the detection value DT may indicate that the timing of the reference clock CLKref is different from the timing of the main clock CLK1.

The timing error detector 271 may output the detection value DT based on a first bit and a second bit included in the second bit string DD[tn, q:1]. For example, the first bit may include the most significant bit DD[tn, q] of the second bit string DD[tn, q:1], and the second bit may include a lower bit(DD[tn, q−1]) that is adjacent to the most significant bit DD[tn, q] and lower than the most significant bit DD[tn, q].

As described with comparing FIG. 5 to FIG. 7, the most significant bit DD[tn, q] of the second bit string DD[tn, q:1] and the lower bit DD[tn, q−1] adjacent thereto may be referenced to detect and resolve the timing error. Therefore, for example, the timing error detector 271 may combine the most significant bit DD[tn, q] of the second bit string DD[tn, q:]) and its lower bit DD[tn, q−1] to generate the detection value DT.

For example, when a value of the first bit (e.g., the most significant bit DD[tn, q]) of the second bit string DD[tn, q:1] is different from a value of the second bit (e.g., the lower bit DD[tn, q−1]) of the second bit string DD[tn, q:1] (refer to FIG. 5), the detection value DT indicating the timing error may not be output. On the other hand, when the value of the first bit (e.g., the most significant bit DD[tn, q]) of the second bit string DD[tn, q:1] is identical to the value of the second bit (e.g., the lower bit DD[tn, q−1]) of the second bit string DD[tn, q:1] (refer to FIG. 7), the detection value DT indicating the timing error may be output.

The slope calculator 273 may generate a slope value SS. The slope value SS may be associated with the sign of the slope of the input signal (e.g., the analog signal AS). The slope value SS may indicate the direction in which the level of the input signal is changed (i.e., an increase or decrease in the level of the input signal).

As described with reference to FIGS. 8 and 9, the sign of the slope of the input signal (i.e., the direction in which the level of the input signal is changed) may be referenced together with the sign of the level error, to determine a direction (i.e., the sign) of the timing error. Thus, the slope calculator 273 may generate the slope value SS associated with the sign of the slope of the input signal. The slope value SS may be calculated from a plurality of samples obtained at different timings.

For example, the output data DD[tn, p:1] may be generated corresponding to the timing to associated with the reference clock CLKref and the main clock CLK1. For example, the following output data DD[t(n+1), p:1] may be generated corresponding to the timing t(n+1) immediately after the timing tn, and the preceding output data DD[t(n−1), p:1] may be generated corresponding to the timing t(n−1) immediately before the timing tn.

The slope value SS may be calculated based on a difference between the following output data DD[t(n+1), p:1] and the preceding output data DD[t(n−1), p:1]. That is, the direction in which the level of the input signal is changed may be obtained based on the difference between the following output data of the following timing and the preceding output data of the preceding timing. This will be described in more detail with reference to FIGS. 11 to 14. The slope calculator 273 may include a memory element for temporarily buffering the preceding output data DD[t(n−1), p:1] and the following output data DD[t(n+1), p:1].

The delay calibrator 275 may output a delay calibration value DC. The delay calibration value DC may be referenced to adjust the delay time associated with transmitting the main clock CLK1. The delay time may be adjusted based on the delay calibration value DC. The delay calibrator 275 may combine the first bit (e.g., the most significant bit DD[tn, q]) of the second bit string DD[tn, q:1] and the slope value SS, to generate the delay calibration value DC.

As described with reference to FIGS. 8 and 9, the sign of the level error may be referenced together with the sign of the slope of the input signal (i.e., the direction in which the level of the input signal is changed), to determine the direction (i.e., the sign) of the timing error. Meanwhile, referring to the example of FIG. 7, it may be understood that the value of the most significant bit DD[7] of the second bit string DD[7:1] is determined to follow a direction in which the level error E[tn] occurs. That is, it may be understood that the most significant bit DD[7] of the second bit string DD[7:1] is associated with the sign of the level error E[tn].

From this perspective, the value of the most significant bit DD[tn, q] of the second bit string DD[tn, q:1] may indicate the sign of the level error, and thus may be referenced to determine the direction of the timing error. The delay calibrator 275 may use the value of the most significant bit DD[tn, q] of the second bit string DD[tn, q:1] to generate the delay calibration value DC. The delay calibration value DC may be generated to resolve the timing error of the determined direction.

The timing error detector 271, the slope calculator 273, and the delay calibrator 275 may include various logic circuits configured to combine inputs to generate an output. The timing error detector 271, the slope calculator 273, and the delay calibrator 275 may include various analog/digital elements to perform the operations described above and to be described below.

The delay circuit 291 may delay a source clock sCLK by the delay time to output the main clock CLK1. The source clock sCLK may be provided from a separate clock generator or may be provided from a clock recovered from the input signal (e.g., the analog signal AS) by a separate CDR circuit. The delay time of the delay circuit 291 may be adjusted based on the delay calibration value DC.

As the delay time increases or decreases based on the delay calibration value DC, the timings of the main clock CLK1 may be delayed or advanced. As the timings of the main clock CLK1 are delayed or advanced, the timings of the main clock CLK1 may be adjusted to be identical to the timings of the reference clock CLKref. Therefore, the timing error between the reference clock CLKref and the main clock CLK1 may be resolved. Examples of adjusting the delay time will be described with reference to FIGS. 11 to 14.

According to the above configurations and operations, the delay time of the delay circuit 291 and the timings of the main clock CLK1 may be adjusted. For example, the delay time of the delay circuit 291 and the timings of the main clock CLK1 may be adjusted when the value of the first bit (e.g., the most significant bit DD[tn, q]) of the second bit string DD[tn, q:1] is identical to the value of the second bit (e.g., the lower bit DD[tn, q−1]), that is, when the timing error occurs. The delay time of the delay circuit 291 and the timings of the main clock CLK1 may be adjusted based on the direction in which the level of the input signal is changed and the value of the first bit (e.g., the most significant bit DD[tn, q]) of the second bit string DD[tn, q:1].

The slope calculator 273 and the delay calibrator 275 may operate in response to the detection value DT. For example, when the detection value DT indicating the timing error is not output from the timing error detector 271, the slope calculator 273 and the delay calibrator 275 may not output the slope value SS and the delay calibration value DC. For example, the slope calculator 273 and the delay calibrator 275 may output the slope value SS and the delay calibration value DC in response to the detection value DT indicating the timing error.

In some example embodiments, while the slope calculator 273 and the delay calibrator 275 do not operate as the detection value DT indicating the timing error is not output, circuits of the slope calculator 273 and the delay calibrator 275 may be turned off or deactivated. For example, turn-off or deactivation may mean that operations of the circuit are interrupted without power supply or intended operations are blocked.

In some example embodiments, the slope calculator 273 and the delay calibrator 275 may be turned on or activated in response to the detection value DT indicating the timing error. In these example embodiments, an amount of power consumed when the timing error does not occur may be reduced.

In some example embodiments, the ADC circuit 200 may include an accumulator 279. The accumulator 279 may accumulate delay calibration values output from the delay calibrator 275. The accumulator 279 may generate a final calibration value based on the accumulated delay calibration values. The delay time of the delay circuit 291 may be adjusted (e.g., increased or decreased) based on the final calibration value.

For example, the accumulator 279 may accumulate the delay calibration values for a reference time duration. Alternatively, for example, the accumulator 279 may accumulate the delay calibration values until the reference number of delay calibration values is accumulated.

In some cases, the delay calibration values may be generated too often, or the delay calibration values may include noises. Due to this reason, adjusting the delay time for each and every timing of the main clock CLK1 may be inefficient or ineffective. Thus, the accumulator 279 may accumulate the delay calibration values depending on the intended criteria and may output the final calibration value. The final calibration value may be referenced to suitably adjust the delay time based on the delay calibration values which are collected sufficiently.

For example, the accumulator 279 may include a logic circuit for summing the delay calibration values. For example, the accumulator 279 may include a low-pass filter (LPF) to filter the delay calibration values. The configuration of the accumulator 279 may be variously modified or changed to accumulate the delay calibration values.

Figure 11:
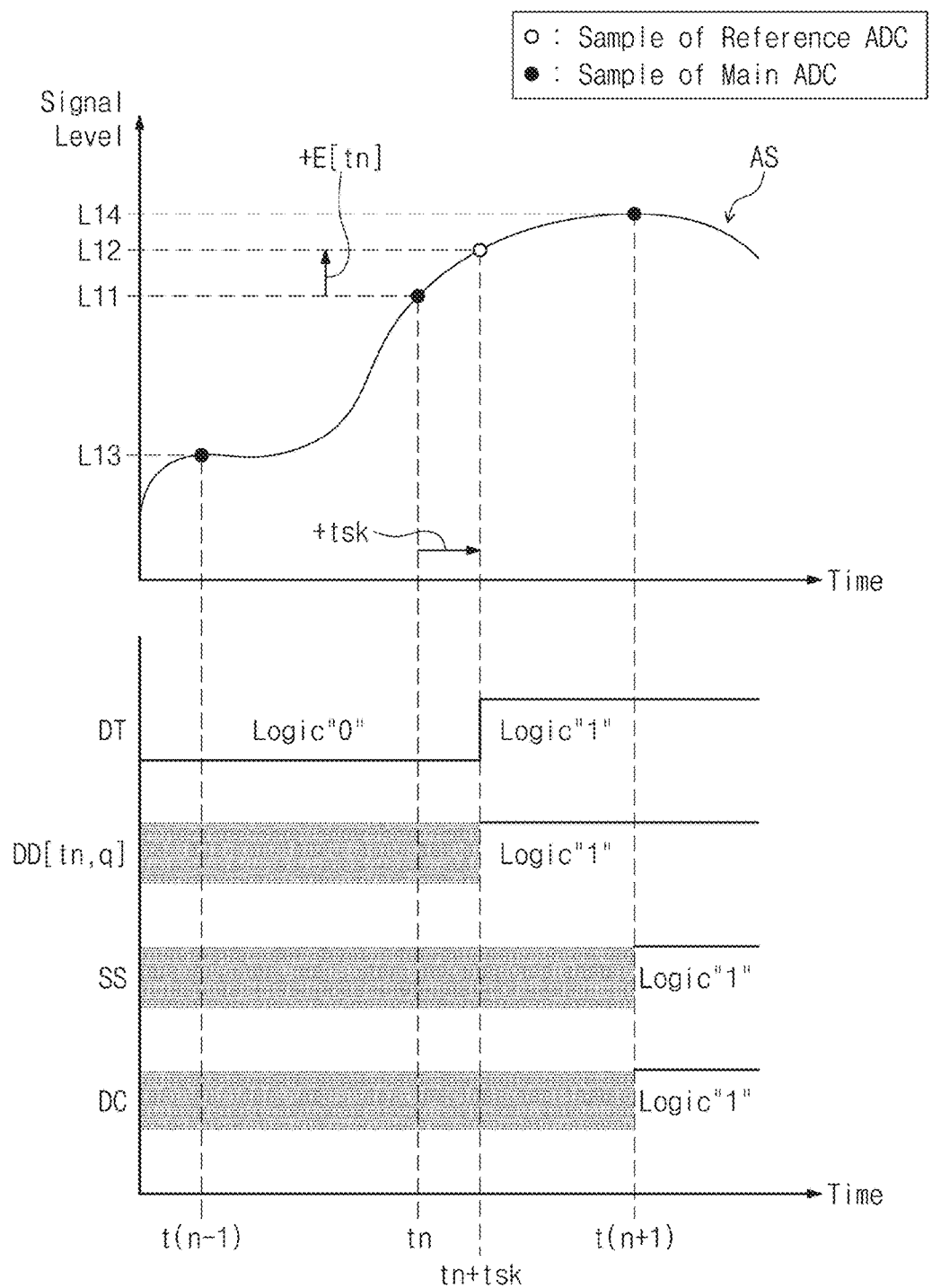
FIGS. 11 to 14 are timing diagrams illustrating example operations of an ADC circuit of FIG. 10.

FIG. 11 is a timing diagram for describing an example operation of the ADC circuit 200 of FIG. 10.

An example of FIG. 11 illustrates that the positive timing error +tsk and the positive level error +E[tn] occur while the slope of the analog signal AS is positive (i.e., while the level of the analog signal AS is increasing). The main ADC 221 may sample the analog signal AS of a level L11 at the timing tn, and the reference ADC 211 may sample the analog signal AS of a level L12 at the timing (tn+tsk). The level error +E[tn] may occur between the level L11 and the level L12.

The timing error detector 271 may output the detection value DT with regard to the timing error +tsk. For example, the detection value DT may have a first logic value (e.g., logic "1") when the timing error +tsk is detected, and may have a second logic value (e.g., logic "0") when the timing error +tsk is not detected.

As the timing error +tsk occurs, the first bit (e.g., the most significant bit DD[tn, q]) of the second bit string DD[tn, q:1] may be identical to the second bit (e.g., the lower bit DD[tn, q−1] adjacent to the most significant bit DD[tn, q]) of the second bit string DD[tn, q:1]. Accordingly, the timing error detector 271 may output the detection value DT having the first logic value.

Meanwhile, as the positive level error +E[tn] occurs, the most significant bit DD[tn, q] of the second bit string DD[tn, q:1] may be generated to have a first logic value (e.g., logic "1"). As described with reference to FIG. 7, the most significant bit DD[tn, q] of the second bit string DD[tn, q:1] may be associated with the sign of the level error +E[tn].

The slope calculator 273 may generate the slope value SS in response to the detection value DT. To calculate the slope value SS, the slope calculator 273 may obtain the preceding output data DD[t(n−1), p:1] which is generated based on a level L13 of the analog signal AS sampled at the preceding timing t(n−1). Further, the slope calculator 273 may obtain the following output data DD[t(n+1), p:1] which is generated based on a level L14 of the analog signal AS sampled at the following timing t(n+1).

The slope calculator 273 may calculate the difference between the following output data DD[t(n+1), p:1] and the preceding output data DD[t(n−1), p:1]. Depending on whether the level of the analog signal AS increases or decreases, the difference between the following output data DD[t(n+1), p:1] and the preceding output data DD[t(n−1), p:1] may be calculated differently.

Therefore, the slope calculator 273 may output the slope value SS indicating whether the level of the analog signal AS increases or decreases, based on the calculation result. For example, when the level of the analog signal AS increases, the slope value SS may have a first logic value (e.g., logic "1").

The increase in the level of the analog signal AS and the positive level error +E[tn] may mean the positive timing error +tsk (refer to FIGS. 8 and 9). Therefore, based on the first logic value of the slope value SS and the first logic value of the most significant bit DD[tn, q] of the second bit string DD[tn, q:1], it may be determined that the positive timing error +tsk occurs. The positive timing error +tsk may mean that the timing of the main clock CLK1 is earlier than the timing of the reference clock CLKref.

The delay calibrator 275 may generate the delay calibration value DC based on the first logic value of the slope value SS and the first logic value of the most significant bit DD[tn, q] of the second bit string DD[tn, q:1]. For example, the delay calibration value DC may have a first logic value (e.g., logic "1"). The delay time of the delay circuit 291 may increase based on the first logic value of the delay calibration value DC.

As the delay time of the delay circuit 291 increases, the timings of the main clock CLK1 may be delayed. Thus, the timings of the main clock CLK1 may be adjusted to be identical to the timings of the reference clock CLKref, and the positive timing error +tsk may be reduced or resolved.

Figure 12:
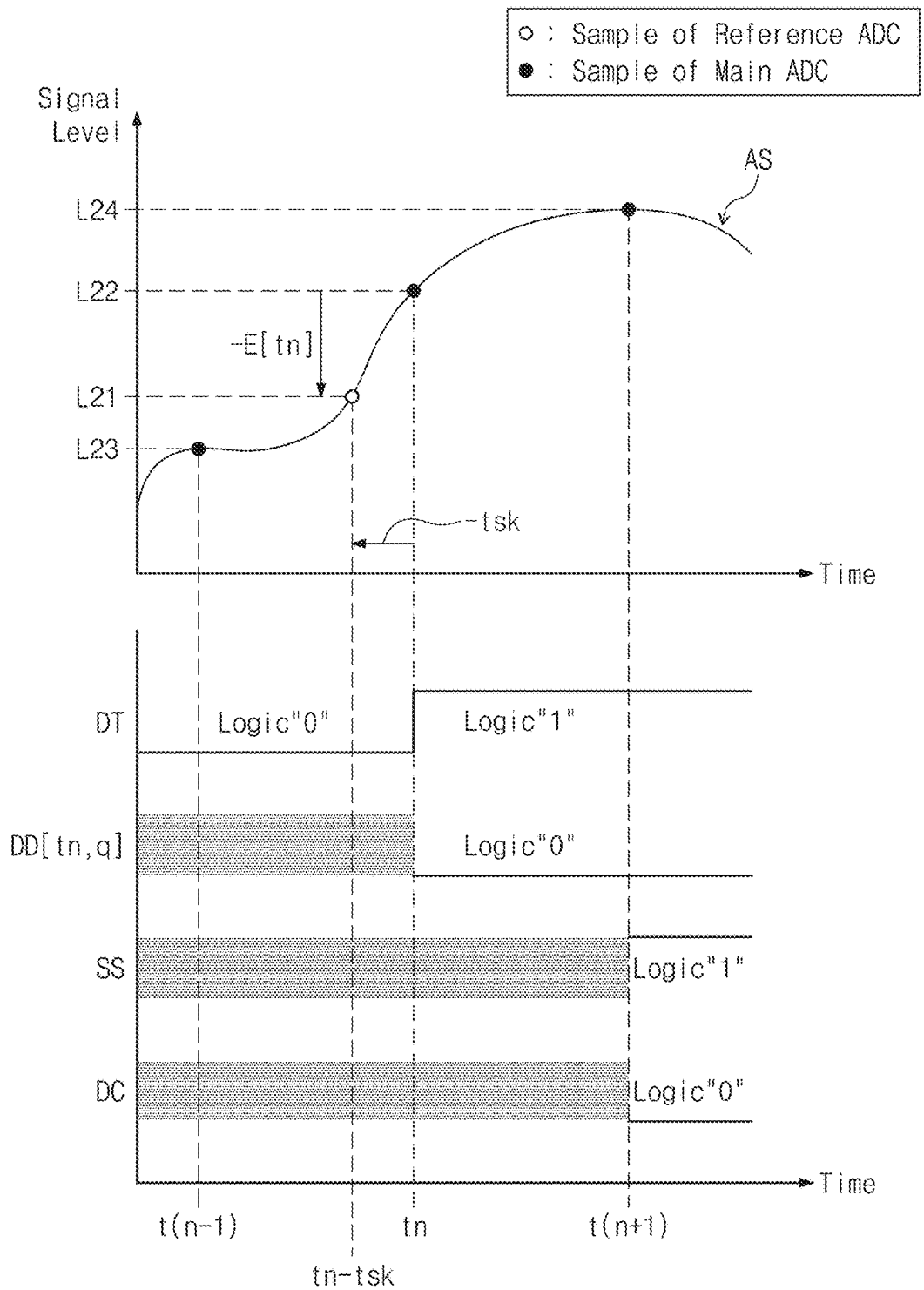

FIG. 12 is a timing diagram for describing an example operation of the ADC circuit 200 of FIG. 10.

An example of FIG. 12 illustrates that the negative timing error −tsk and the negative level error −E[tn] occur while the slope of the analog signal AS is positive (i.e., while the level of the analog signal AS is increasing). The reference ADC 211 may sample the analog signal AS of a level L21 at the timing (tn−tsk), and the main ADC 221 may sample the analog signal AS of a level L22 at the timing tn. The level error −E[tn] may occur between the level L21 and the level L22.

As the timing error −tsk occurs, the first bit (e.g., the most significant bit DD[tn, q]) of the second bit string DD[tn, q:1] may be identical to the second bit (e.g., the lower bit DD[tn, q−1] adjacent to the most significant bit DD[tn, q]) of the second bit string DD[tn, q:1]. Accordingly, the timing error detector 271 may output the detection value DT having the first logic value. Meanwhile, as the negative level error −E[tn] occurs, the most significant bit DD[tn, q] of the second bit string DD[tn, q:1] may be generated to have a second logic value (e.g., logic "0").

To calculate the slope value SS, the slope calculator 273 may obtain the preceding output data DD[t(n−1), p:1] which is generated based on a level L23 of the analog signal AS sampled at the preceding timing t(n−1). Further, the slope calculator 273 may obtain the following output data DD[t(n+1), p:1] which is generated based on a level L24 of the analog signal AS sampled at the following timing t(n+1).

Based on the difference between the following output data DD[t(n+1), p:1] and the preceding output data DD[t(n−1), p:1], the slope calculator 273 may output the slope value SS of a first logic value (e.g., logic "1") indicating that the level of the analog signal AS increases.

The increase in the level of the analog signal AS and the negative level error −E[tn] may mean the negative timing error −tsk (refer to FIGS. 8 and 9). Therefore, based on the first logic value of the slope value SS and the second logic value of the most significant bit DD[tn, q] of the second bit string DD[tn, q:1], it may be determined that the negative timing error −tsk occurs. The negative timing error −tsk may mean that the timing of the main clock CLK1 is later than the timing of the reference clock CLKref.

The delay calibrator 275 may generate the delay calibration value DC based on the first logic value of the slope value SS and the second logic value of the most significant bit DD[tn, q] of the second bit string DD[tn, q:1]. For example, the delay calibration value DC may have a second logic value (e.g., logic "0"). The delay time of the delay circuit 291 may decrease based on the second logic value of the delay calibration value DC.

As the delay time of the delay circuit 291 decreases, the timings of the main clock CLK1 may be advanced. Thus, the timings of the main clock CLK1 may be adjusted to be identical to the timings of the reference clock CLKref, and the negative timing error −tsk may be reduced or resolved.

Figure 13:
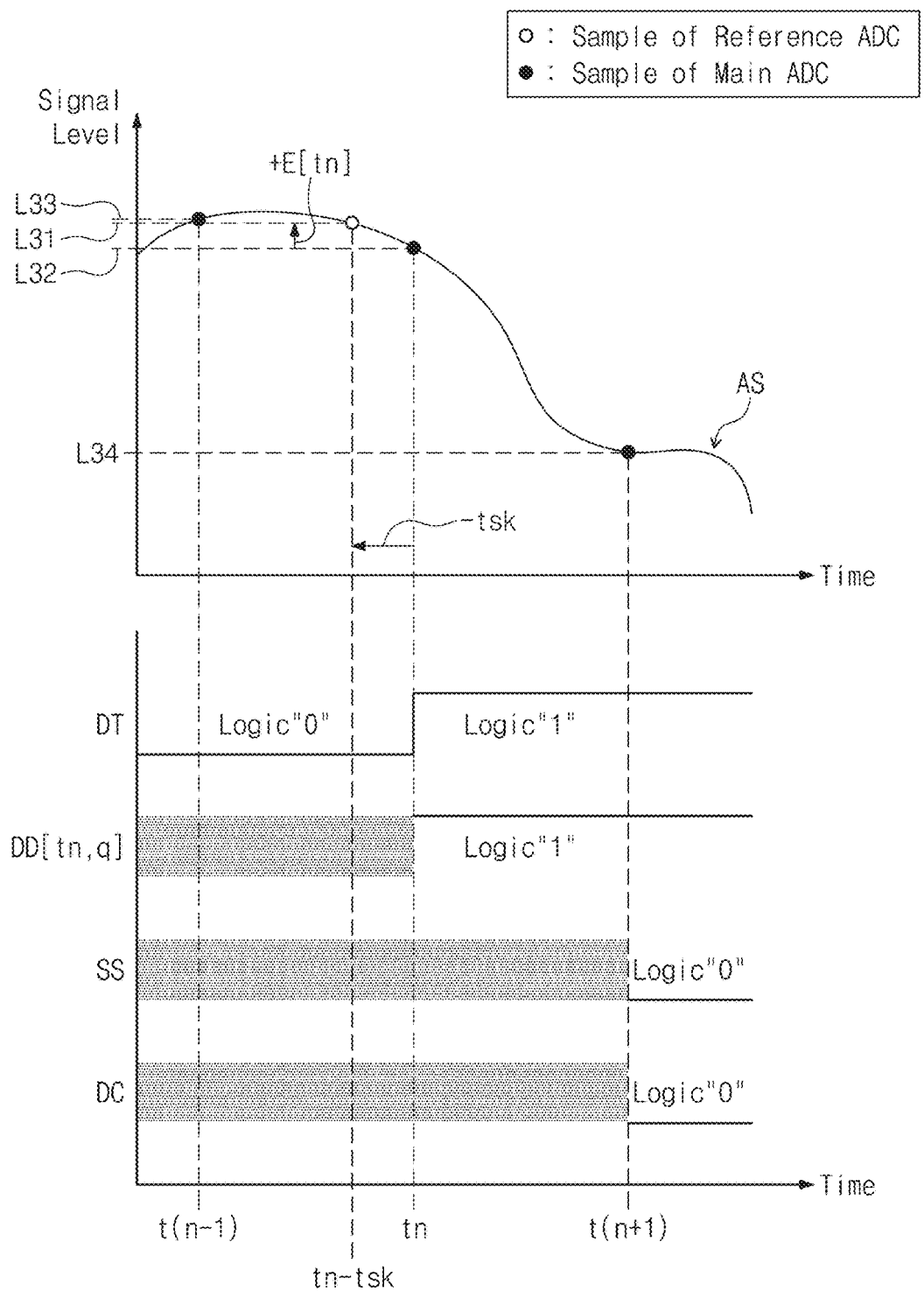

FIG. 13 is a timing diagram for describing an example operation of the ADC circuit 200 of FIG. 10.

An example of FIG. 13 illustrates that the negative timing error −tsk and the positive level error +E[tn] occur while the slope of the analog signal AS is negative (i.e., while the level of the analog signal AS is decreasing). The reference ADC 211 may sample the analog signal AS of a level L31 at the timing (tn−tsk), and the main ADC 221 may sample the analog signal AS of a level L32 at the timing tn. The level error +E[tn] may occur between the level L31 and the level L32.

As the timing error −tsk occurs, the first bit (e.g., the most significant bit DD[tn, q]) of the second bit string DD[tn, q:1] may be identical to the second bit (e.g., the lower bit DD[tn, q−1] adjacent to the most significant bit DD[tn, q]) of the second bit string DD[tn, q:1]. Accordingly, the timing error detector 271 may output the detection value DT having the first logic value. Meanwhile, as the positive level error +E[tn] occurs, the most significant bit DD[tn, q] of the second bit string DD[tn, q:1] may be generated to have a first logic value (e.g., logic "1").

To calculate the slope value SS, the slope calculator 273 may obtain the preceding output data DD[t(n−1), p:1] which is generated based on a level L33 of the analog signal AS sampled at the preceding timing t(n−1). Further, the slope calculator 273 may obtain the following output data DD[t(n+1), p:1] which is generated based on a level L34 of the analog signal AS sampled at the following timing t(n+1).

Based on the difference between the following output data DD[t(n+1), p:1] and the preceding output data DD[t(n−1), p:1], the slope calculator 273 may output the slope value SS of a second logic value (e.g., logic "0") indicating that the level of the analog signal AS decreases.

The decrease in the level of the analog signal AS and the positive level error +E[tn] may mean the negative timing error −tsk (refer to FIGS. 8 and 9). Therefore, based on the second logic value of the slope value SS and the first logic value of the most significant bit DD[tn, q] of the second bit string DD[tn, q:1], it may be determined that the negative timing error −tsk occurs.

The delay calibrator 275 may generate the delay calibration value DC based on the second logic value of the slope value SS and the first logic value of the most significant bit DD[tn, q] of the second bit string DD[tn, q:1]. For example, the delay calibration value DC may have a second logic value (e.g., logic "0"). The delay time of the delay circuit 291 may decrease based on the second logic value of the delay calibration value DC. As the delay time of the delay circuit 291 decreases, the timings of the main clock CLK1 may be advanced.

Figure 14:
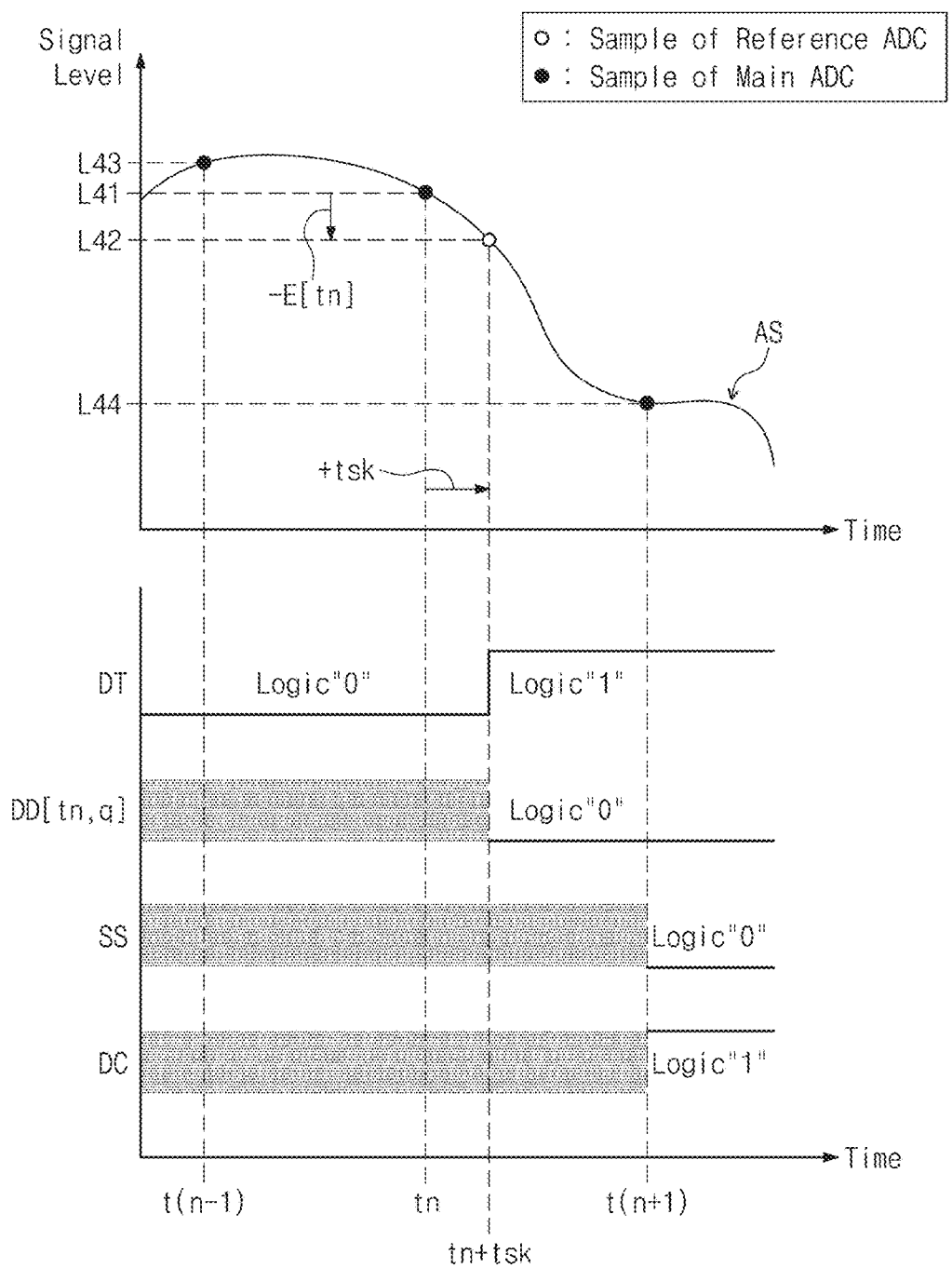

FIG. 14 is a timing diagram for describing an example operation of the ADC circuit 200 of FIG. 10.

An example of FIG. 14 illustrates that the positive timing error +tsk and the negative level error −E[tn] occur while the slope of the analog signal AS is negative (i.e., while the level of the analog signal AS is decreasing). The main ADC 221 may sample the analog signal AS of a level L41 at the timing tn, and the reference ADC 211 may sample the analog signal AS of a level L42 at the timing (tn+tsk). The level error −E[tn] may occur between the level L41 and the level L42.

As the timing error +tsk occurs, the first bit (e.g., the most significant bit DD[tn, q]) of the second bit string DD[tn, q:1] may be identical to the second bit (e.g., the lower bit DD[tn, q−1] adjacent to the most significant bit DD[tn, q]) of the second bit string DD[tn, q:1]. Accordingly, the timing error detector 271 may output the detection value DT having the first logic value. Meanwhile, as the negative level error −E[tn] occurs, the most significant bit DD[tn, q] of the second bit string DD[tn, q:1] may be generated to have a second logic value (e.g., logic "0").

To calculate the slope value SS, the slope calculator 273 may obtain the preceding output data DD[t(n−1), p:1] which is generated based on a level L43 of the analog signal AS sampled at the preceding timing t(n−1). Further, the slope calculator 273 may obtain the following output data DD[t(n+1), p:1] which is generated based on a level L44 of the analog signal AS sampled at the following timing t(n+1).

Based on the difference between the following output data DD[t(n+1), p:1] and the preceding output data DD[t(n−1), p:1], the slope calculator 273 may output the slope value SS of a second logic value (e.g., logic "0") indicating that the level of the analog signal AS decreases.

The decrease in the level of the analog signal AS and the negative level error −E[tn] may mean the positive timing error +tsk (refer to FIGS. 8 and 9). Therefore, based on the second logic value of the slope value SS and the second logic value of the most significant bit DD[tn, q] of the second bit string DD[tn, q:1], it may be determined that the positive timing error +tsk occurs.

The delay calibrator 275 may generate the delay calibration value DC based on the second logic value of the slope value SS and the second logic value of the most significant bit DD[tn, q] of the second bit string DD[tn, q:1]. For example, the delay calibration value DC may have a first logic value (e.g., logic "1"). The delay time of the delay circuit 291 may increase based on the first logic value of the delay calibration value DC. As the delay time of the delay circuit 291 increases, the timings of the main clock CLK1 may be delayed.

According to the example embodiments of the present disclosure, timing errors of clocks may be resolved, and thus the clocks may be accurately controlled. As a result, the ADC circuit 200 and the electronic device including the ADC circuit 200 may operate stably and reliably, and may satisfy requirements such as a resolution, an error rate, a dynamic range, and/or the like.

Figure 15:
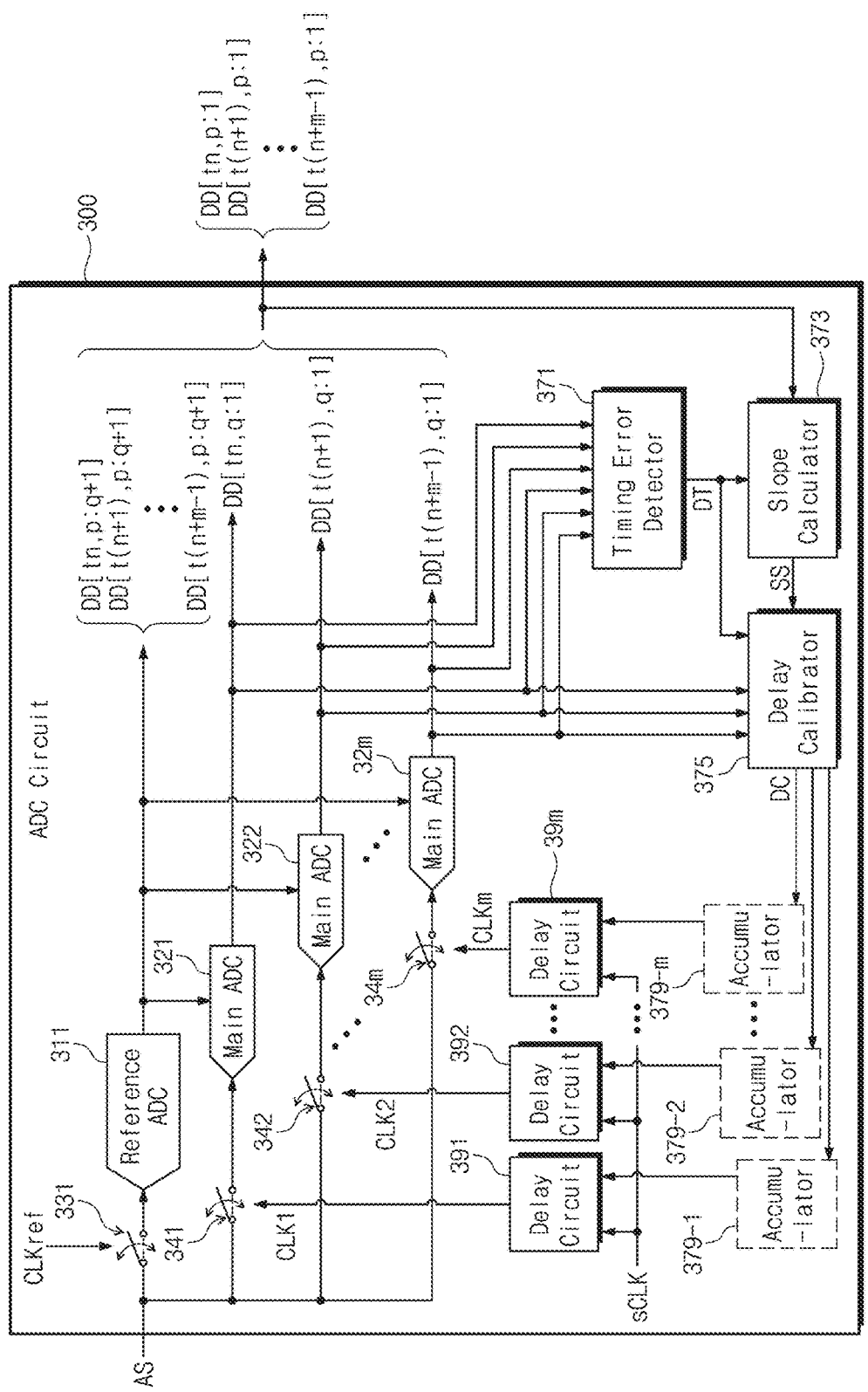
FIG. 15 is a block diagram illustrating an example configuration of an ADC circuit of FIG. 1.

FIG. 15 is a block diagram illustrating an example configuration of the ADC circuit 1115 or 1315 of FIG. 1. In some example embodiments, at least one of the ADC circuits 1115 and/or 1315 of FIG. 1 may include an ADC circuit 300 of FIG. 15.

The ADC circuit 300 may be implemented with an electronic circuit configured to perform operations to be described below. The ADC circuit 300 may include various analog/digital circuits to perform the operations to be described below.

For example, the ADC circuit 300 may include a reference ADC 311, a plurality of main ADCs 321 to 32m, switches 331 and 341 to 34m, a timing error detector 371, a slope calculator 373, a delay circuit 375, and a plurality of delay circuits 391 to 39m. In some example embodiments, the ADC circuit 300 may include accumulators 379-1 to 379-m.

The reference ADC 311, the switch 331, the timing error detector 371, the slope calculator 373, and the delay calibrator 375 may correspond to the reference ADC 211, the switch 231, the timing error detector 271, the slope calculator 273, and the delay calibrator 275, respectively. Each of the main ADCs 321 to 32m may correspond to the main ADC 221 of FIG. 10. Each of the switches 341 to 34m may correspond to the switch 241 in FIG. 10. Each of the accumulators 379-1 to 379-m may correspond to the accumulator 279 of FIG. 10. Each of the delay circuits 391 to 39m may correspond to the delay circuit 291 of FIG. 10. For brevity, redundant descriptions will be omitted below.

Comparing the example of FIG. 15 with the example of FIG. 10, the ADC circuit 300 may employ the main ADCs 321 to 32m, instead of a single main ADC. As the switches 341 to 34m operate in response to the plurality of main clocks CLK1 to CLKm respectively, the main ADCs 321 to 32m may operate in response to the main clocks CLK1 to CLKm respectively. The main ADCs 321 to 32m may process the input signal (e.g., the analog signal AS) in parallel, in response independently to the main clocks CLK1 to CLKm.

The main clocks CLK1 to CLKm may provide different timings. For example, the main clocks CLK1 to CLKm may be time-interleaved such that the input signal is sampled successively at each of the different timings. From this perspective, the ADC circuit 300 may be understood as a time-interleaved ADC or a TI-ADC.

When high processing performance (e.g., analog-to-digital conversion performance) is required in the ADC circuit 300, it may be required to employ a high frequency clock. However, implementing a clock signal at a significantly high frequency may be physically difficult.

Thus, the main clocks CLK1 to CLKm which are time-interleaved may be employed. Each of the main clocks CLK1 to CLKm may have a low frequency, and may be relatively easily implemented. Although each of the main clocks CLK1 to CLKm has a low frequency, the main clocks CLK1 to CLKm which are time-interleaved may provide timings sufficient to sample the input signal.

The delay circuits 391 to 39m may provide different delay times. The delay circuits 391 to 39m may delay the source clock sCLK by different delay times and output the main clocks CLK1 to CLKm respectively. Thus, the main clocks CLK1 to CLKm may provide different timings.

The ADC circuit 300 may output a plurality of output data DD[tn, p:1] to DD[t(n+m−1), p:1] with regard to different timings tn to t(n+m−1). The output data DD[tn, p:1] to DD[t(n+m−1), p:1] may be converted from the input signal (e.g., the analog signal AS) sampled at the timings tn to t(n+m−1).

The reference ADC 311 may convert the input signal to first bit strings DD[tn, p:q+1] to DD[t(n+m−1), p:q+1] of the output data DD[tn, p:1] to DD[t(n+m−1), p:1]. The reference ADC 311 may generate the first bit strings DD[tn, p:q+1] to DD[t(n+m−1), p:q+1] with regard to the timings tn to t(n+m−1) with regard to the reference clock CLKref. The first bit strings DD[tn, p:q+1] to DD[t(n+m−1), p:q+1] may be provided respectively to the main ADCs 321 to 32m.

As the main clocks CLK1 to CLKm are time-interleaved, the main ADCs 321 to 32m may operate with regard to the timings tn through t(n+m−1) respectively. The main ADCs 321 to 32m may convert the input signal to second bit strings DD[tn, q:1] to DD[t(n+m−1), q:1] of the output data DD[tn, p:1] to DD[t(n+m−1), p:1] respectively. The main ADCs 321 to 32m may generate the second bit strings DD[tn, q:1] to DD[t(n+m−1), q:1] with regard to the timings tn to t(n+m−1) in response to the main clocks CLK1 to CLKm.

For example, the main ADC 322 may receive the first bit string DD[t(n+1), p:q+1] of the output data DD[t(n+1), p:1] from the reference ADC 311 with regard to the timing t(n+1). For example, the main ADC 322 may convert the input signal to the second bit string DD[t(n+1), q:1] of the output data DD[t(n+1), p:1] with regard to the timing t(n+1) in response to the main clock CLK2. The ADC circuit 300 may output the output data DD[t(n+1), p:1] based on the first bit string DD[t(n+1), p:q+1] and the second bit string DD[t(n+1), q:1] with regard to the timing t(n+1).

Meanwhile, as described above, various factors may affect the timings of the reference clock CLKref and/or the main clocks CLK1 to CLKm. A timing error may cause a level error, and may deteriorate stability and reliability. Therefore, resolving the timing error and the level error may be an important issue.

The timing error detector 371 may detect a timing error between the reference clock CLKref and each of the main clocks CLK1 to CLKm. The timing error detector 371 may output the detection value DT based on the detection result. For example, when a timing error occurs between the reference clock CLKref and a main clock among the main clocks CLK1 to CLKm, the detection value DT may indicate that the timing of the reference clock CLKref is different from the timing of the main clock.

To detect timing errors, the timing error detector 371 may refer to a first bit (e.g., the most significant bit) of each of the second bit strings DD[tn, q:1] to DD[t(n+m−1), q:1]. Further, to detect the timing errors, the timing error detector 371 may refer to a second bit (e.g., a bit which is adjacent to the most significant bit and is lower than the most significant bit) of each of the second bit strings DD[tn, q:1] to DD[t(n+m−1), q:1].

When a value of the first bit of one bit string among the second bit strings DD[tn, q:1] to DD[t(n+m−1), q:1] is identical to a value of the second bit of the one bit string among the second bit strings DD[tn, q:1] to DD[t(n+m−1), q:1], the timing error detector 371 may output the detection value DT indicating a timing error.

For example, with regard to the timing t(n+1), when a value of the most significant bit DD[t(n+1), q] of the second bit string DD[t(n+1), q:1] is identical to a value of a lower bit DD[t(n+1), q−1] adjacent to the most significant bit DD[t(n+1), q] of the second bit string DD[t(n+1), q:1], the timing error detector 371 may output the detection value DT indicating a timing error between the reference clock CLKref and the main clock CLK2.

The slope calculator 373 may generate the slope value SS. The slope value SS may be obtained based on a difference between the following output data of the following timing and the preceding output data of the preceding timing. For example, when a timing error is detected with regard to the timing t(n+1), the slope value SS may be calculated based on a difference between the following output data DD[t(n+2), p:1] of the following timing t(n+2) and the preceding output data DD[tn, p:1] of the preceding timing tn.

The delay calibrator 375 may output the delay calibration value DC. The delay calibrator 375 may generate the delay calibration value DC based on the first bit (e.g., the most significant bit) of each of the second bit strings DD[tn, q:1] to DD[t(n+m−1), q:1] and the slope value SS. The delay calibration value DC may be referenced to adjust the delay times of the delay circuits 391 to 39m.

The delay calibration value DC may adjust a delay time of a delay circuit which outputs a main clock associated with the timing error. For example, when a timing error is detected with regard to the timing t(n+1), the delay calibrator 375 may generate the delay calibration value DC based on the most significant bit DD[t(n+1), q] of the second bit string DD[t(n+1), q:1] and the slope value SS. Afterwards, the delay time of the delay circuit 392 which outputs the main clock CLK2 may be adjusted based on the delay calibration value DC. Thus, the timings of the main clock CLK2 may be adjusted.

The different delay times of the delay circuits 391 to 39m may be adjusted such that the different timings of the main clocks CLK1 to CLKm are adjusted. Herein, the delay times of the delay circuits 391 to 39m may be adjusted independently based on the slope value SS (i.e., the direction in which the level of the input signal is changed) and the first bits of the second bit strings DD[tn, q:1] to DD[t(n+m−1), q:1] respectively. Thus, the timings of the main clocks CLK1 to CLKm may be adjusted independently.

For example, the delay time of the delay circuit 391 may be adjusted based on the slope value SS and the most significant bit DD[tn, q] of the second bit string DD[tn, q:1], to adjust the timings of the main clock CLK1. The delay time of the delay circuit 392 may be adjusted based on the slope value SS and the most significant bit DD[t(n+1), q] of the second bit string DD[t(n+1), q:1], to adjust the timings of the main clock CLK2. The delay time of the delay circuit 391 may be adjusted independently from adjusting the delay time of the delay circuit 392.

Depending on the above configurations and operations, the timings of the main clocks CLK1 to CLKm may be aligned with the timings of the reference clock CLKref. Thus, the timing error may be resolved, and skew mismatch between the time-interleaved main clocks CLK1 to CLKm may be resolved.

Figure 16:
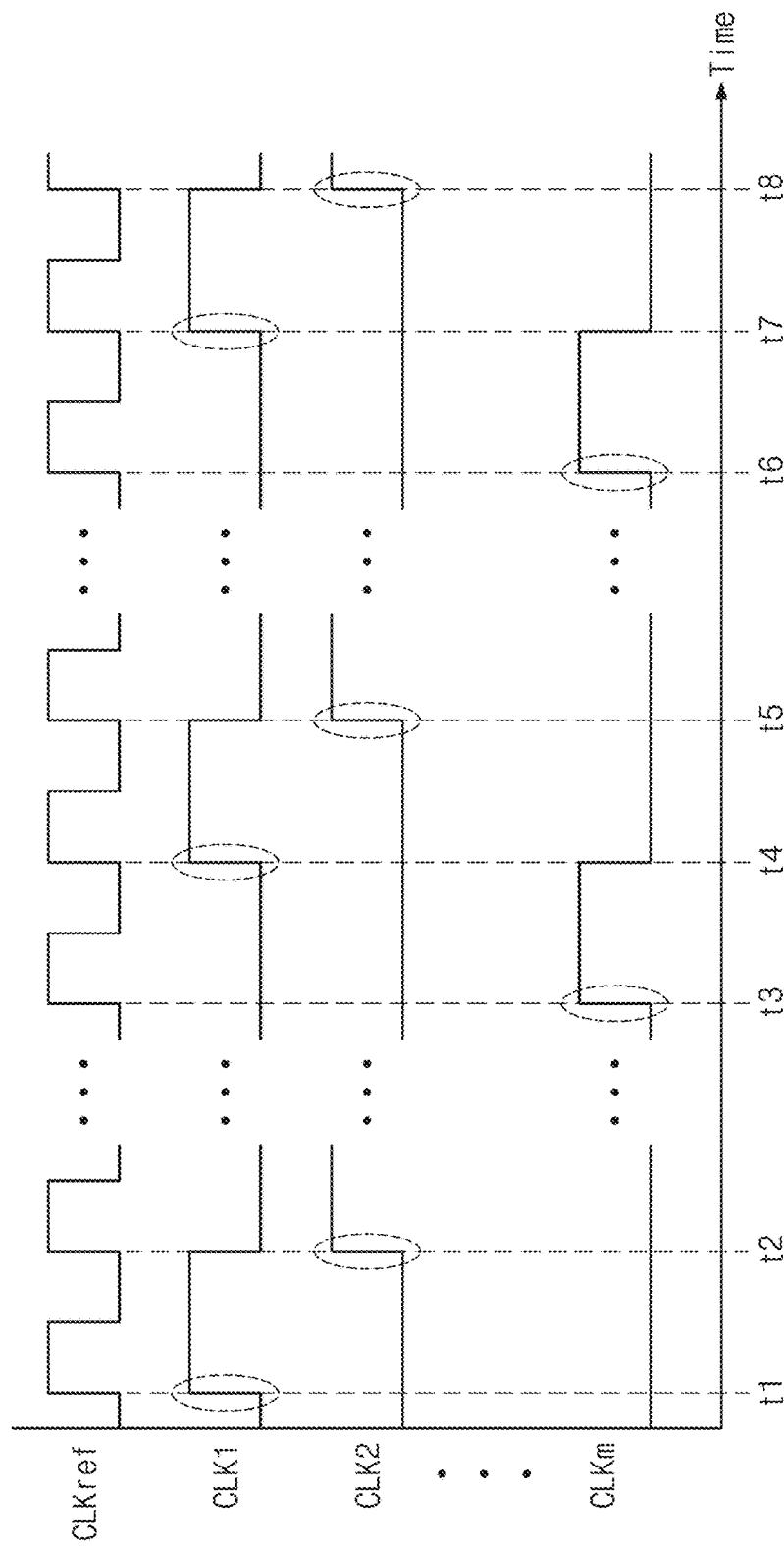
FIG. 16 is a timing diagram illustrating example clocks handled in an ADC circuit of FIG. 15.

FIG. 16 is a timing diagram illustrating example clocks handled in the ADC circuit 300 of FIG. 15.

The main clocks CLK1 to CLKm may be time-interleaved. Thus, the main clocks CLK1 to CLKm may provide different timings. For example, the main clock CLK1 may provide a timing at time t1, and the main clock CLK2 may provide a timing at time t2 following time t1. In such a manner, the main clocks CLK1 to CLKm may provide timings for successively sampling the input signal.

Meanwhile, the timing of the reference clock CLKref may correspond to a timing of a different main clock for each cycle of the reference clock CLKref. For example, the timing of the reference clock CLKref may correspond to the timing of the main clock CLK1 at time t1, and may correspond to the timing of the main clock CLK2 at time t2. For example, the timings of the reference clock CLKref may correspond to the timings of different main clocks at time t1 to time t8.

In such a manner, the timings of the reference clock CLKref may correspond once to each and every one of the main clocks CLK1 to CLKm. Therefore, it may be detected whether there is a timing error between the timing of the reference clock CLKref and the timing of each of the main clocks CLK1 to CLKm, and the timings of each and every one of the main clocks CLK1 to CLKm may be adjusted. Further, the timings of all the main clocks CLK1 to CLKm may be aligned with the timings of the reference clock CLKref.

Figure 17:
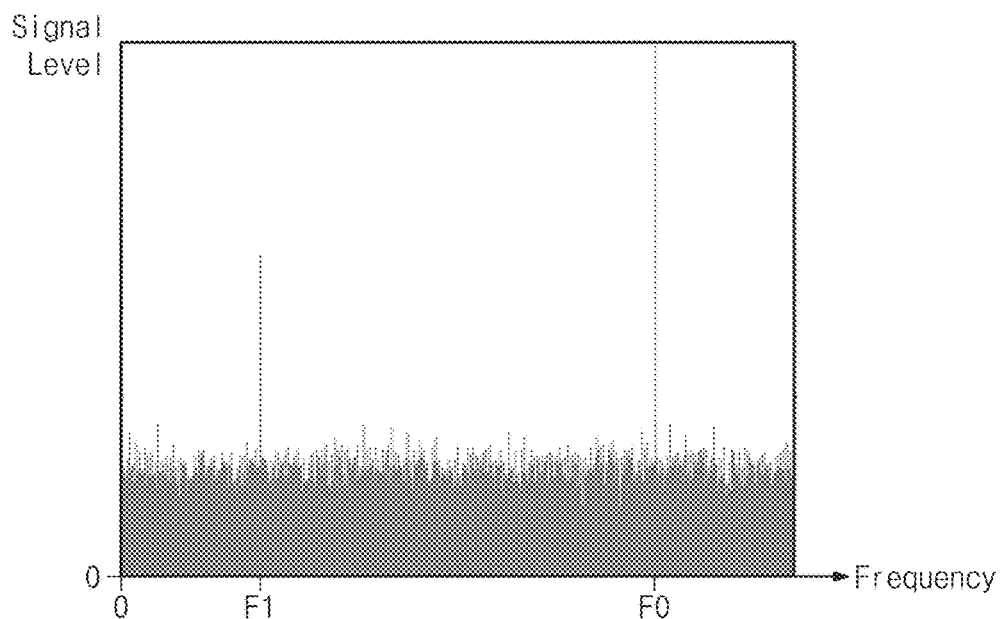
FIGS. 17 and 18 are graphs illustrating results of an example simulation in which timings of main clocks are adjusted in an ADC circuit of FIG. 15.
Figure 18:
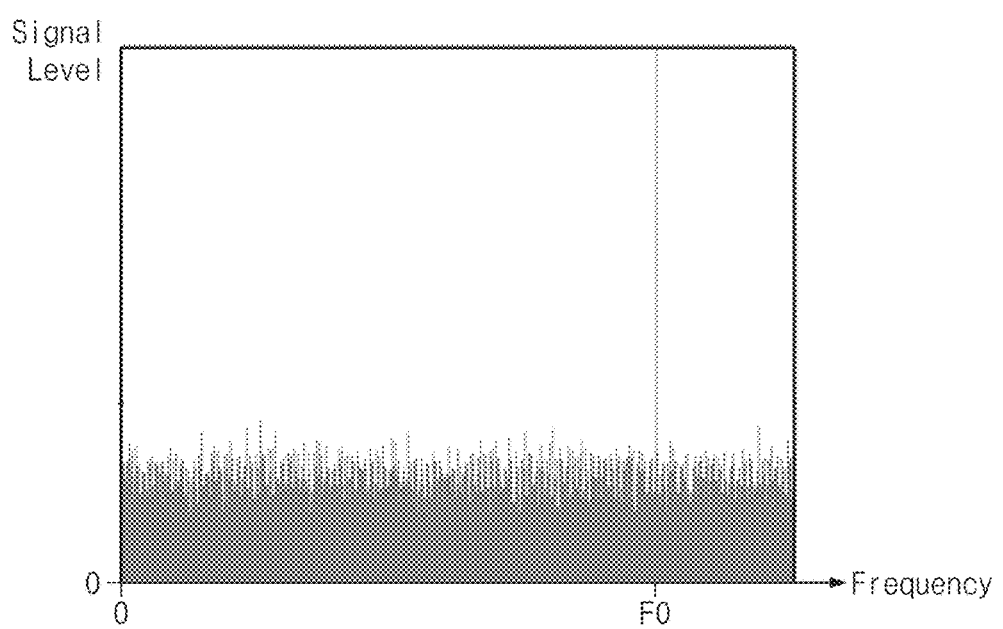

FIGS. 17 and 18 are graphs illustrating results of an example simulation in which the timings of the main clocks are adjusted in the ADC circuit 300 of FIG. 15. For example, FIGS. 17 and 18 illustrate results of a simulation performed under a condition in which two main ADCs and two main clocks are employed.

FIG. 17 illustrates signal levels of outputs obtained before the timings of the main clocks are adjusted, and FIG. 18 illustrates the signal levels of the outputs obtained after the timings of the main clocks are adjusted. Referring to FIGS. 17 and 18, a frequency F0 may correspond to a clock frequency that is intended to operate the ADC circuit 300. On the other hand, a frequency F1 may be associated with outputs (i.e., noise components) obtained due to the timing error.

Comparing FIG. 18 with FIG. 17, it may be understood that the outputs of the frequency F1 due to the timing error are eliminated as the timings of the main clocks are adjusted. In the simulation condition of FIG. 17, spurious-free dynamic range (SFDR) was 47.77 dB, signal to noise-and-distortion ratio (SNDR) was 47.63 dB, and effective number of bits (ENOB) was 7.62 bits. On the other hand, in the simulation condition of FIG. 18, SFDR was 83.75 dB, SNDR was 62.43 dB, and ENOB was 10.08 bits.

Referring to the above results, as the timings of the main clocks are adjusted, the timings of the main clocks may be aligned to the timings of the reference clock, and thus timing errors and skew mismatch may be resolved. That is, it may be understood that example embodiments of the present disclosure are useful to accurately control a plurality of clocks.

Figure 19:
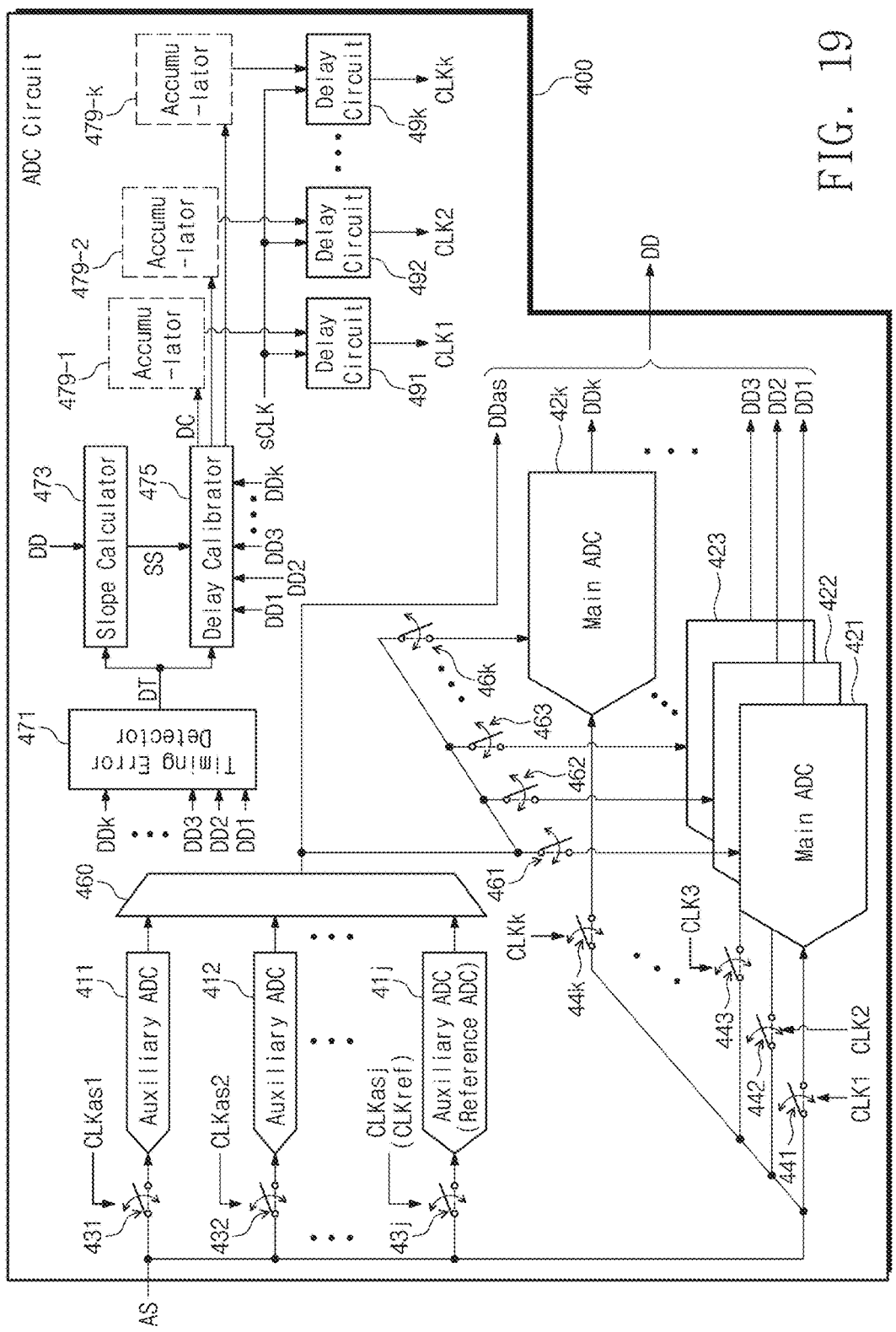
FIG. 19 is a block diagram illustrating an example configuration of an ADC circuit of FIG. 1.

FIG. 19 is a block diagram illustrating an example configuration of the ADC circuit 1115 or 1315 of FIG. 1. In some example embodiments, at least one of the ADC circuits 1115 and/or 1315 of FIG. 1 may include an ADC circuit 400 of FIG. 19.

The ADC circuit 400 may be implemented with an electronic circuit configured to perform operations to be described below. The ADC circuit 400 may include various analog/digital circuits to perform the operations to be described below.

For example, the ADC circuit 400 may include a plurality of auxiliary ADCs 411 to 41j, a plurality of main ADCs 421 to 42k, switches 431 to 43j and 441 to 44k, switches 460 and 461 to 46k, a timing error detector 471, a slope calculator 473, a delay calibrator 475 and a plurality of delay circuits 491 to 49k. In some example embodiments, the ADC circuit 400 may include accumulators 479-1 to 479-k.

Each of the auxiliary ADCs 411 to 41j may correspond to the reference ADC 311 of FIG. 15, and each of the switches 431 to 43j may correspond to the switch 331 of FIG. 15. The main ADCs 421 to 42k may correspond to the main ADCs 321 to 32m of FIG. 15, and the switches 441 to 44k may correspond to the switches 341 to 34m of FIG. 15. The timing error detector 471, the slope calculator 473, and the delay calibrator 475 may correspond to the timing error detector 371, the slope calculator 373, and the delay calibrator 375 of FIG. 15. The accumulators 479-1 to 479-k may correspond to the accumulators 379-1 to 379-m in FIG. 15. The delay circuits 491 to 49k may correspond to the delay circuits 391 to 39m in FIG. 15. For brevity, redundant descriptions will be omitted below.

Comparing the example of FIG. 19 to the example of FIG. 15, the ADC circuit 400 may employ the auxiliary ADCs 411 to 41j, instead of a single reference ADC. As the switches 431 to 43j operate in response to a plurality of auxiliary clocks CLKas1 to CLKasj respectively, the auxiliary ADCs 411 to 41j may operate in response to the auxiliary clocks CLKas1 to CLKasj respectively. The auxiliary ADCs 411 to 41j may process the input signal (e.g., the analog signal AS) in parallel, in response to the auxiliary clocks CLKas1 to CLKasj independently.

Similar to the main clocks CLK1 to CLKk, the auxiliary clocks CLKas1 to CLKasj may provide different timings. For example, the auxiliary clocks CLKas1 to CLKasj may be time-interleaved such that the input signal is sampled successively at each of the different timings.

When very high processing performance (e.g., analog-to-digital conversion performance) is required in the ADC circuit 400, it may be required to employ a very high frequency clock. However, it may be physically difficult to increase the frequency of the single reference clock CLKref illustrated in FIG. 16. Thus, the auxiliary clocks CLKas1 to CLKasj which are time-interleaved may be employed. Each of the auxiliary clocks CLKas1 to CLKasj may have a low frequency, and may be relatively easily implemented.

The ADC circuit 400 may output a plurality of output data with regard to different timings. For example, the ADC circuit 400 may output output data DD with regard to a timing. The output data DD may be converted from the input signal (e.g., the analog signal AS) that is sampled at the timing.

The auxiliary ADCs 411 to 41j may respectively convert the input signal to the first bit strings of the output data, in response to the auxiliary clocks CLKas1 to CLKasj respectively. As the auxiliary clocks CLKas1 to CLKasj are time-interleaved, the auxiliary ADCs 411 to 41j may output the first bit strings with regard to different timings. For example, when the auxiliary clock CLKasj provides the timing associated with the output data DD, the auxiliary ADC 41j may generate a first bit string DDas of the output data DD.

The first bit strings output from the auxiliary ADCs 411 to 41j may be provided to the main ADCs 421 to 42k. A first bit string output from one auxiliary ADC among the auxiliary ADCs 411 to 41j may be provided to a main ADC which operates at a timing associated with the one auxiliary ADC. For example, when the main ADC 421 operates at the timing associated with the auxiliary ADC 41j, the first bit string DDas output from the auxiliary ADC 41j may be provided to the main ADC 421.

The switch 460 may selectively output the first bit strings provided from the auxiliary ADCs 411 to 41j. For example, when the auxiliary ADC 41j operates at a timing, the switch 460 may receive the first bit string DDas provided from the auxiliary ADC 41j, and may output the received first bit string DDas.

The switches 461 to 46k may switch connection between the switch 460 and the main ADCs 421 to 42k. Therefore, the first bit string output from the switch 460 may be or may not be transmitted to the main ADCs 421 to 42k. Depending on operations of the switches 461 to 46k, the first bit string output from the switch 460 may be provided to a main ADC which operates at a timing associated with an auxiliary ADC which outputs the first bit string.

For example, when the main ADC 421 operates at the timing associated with the auxiliary ADC 41j, the switch 460 may output the first bit string DDas provided from the auxiliary ADC 41j. Further, depending on the operation of the switch 461, the first bit string DDas may be provided to the main ADC 421. Depending on the operations of the switches 462 to 46k, the first bit string DDas may not be provided to the main ADCs 422 to 42k.

For example, the operations of the switches 460 and 461 to 46k may be controlled by a separate control circuit. Alternatively, for example, the switches 460 and 461 to 46k may be connected or disconnected based on the auxiliary clocks CLKas1 to CLKasj and the main clocks CLK1 to CLKk. The switches 460 and 461 to 46k may be implemented with any element capable of switching connection.

The main ADCs 421 to 42k may respectively convert the input signal (e.g., the analog signal AS) to second bit strings of the output data, in response to the main clocks CLK1 to CLKk respectively. As the main clocks CLK1 to CLKk are time-interleaved, the main clocks CLK1 to CLKk may provide different timings and the main ADCs 421 to 42k may generate second bit strings DD1 to DDk with regard to different timings.

For example, the main ADC 421 may generate the second bit string DD1 of the output data DD with regard to a specific timing. For example, the main ADC 422 may generate the second bit string DD2 of the following output data with regard to the following timing immediately after the specific timing. In such a manner, the main ADCs 421 to 42k may output the second bit strings DD1 to DDk respectively, for different output data.

In some example embodiments, one auxiliary ADC among the auxiliary ADCs 411 to 41j may be selected as a reference ADC. For example, the auxiliary ADC 41j may be selected as the reference ADC. In this case, the auxiliary clock CLKasj may be provided as the reference clock CLKref.

In the above example, the first bit string DDas output from the auxiliary ADC 41j may be referenced to adjust the timings of the main clocks CLK1 to CLKk, and the timings of the main clocks CLK1 to CLKk may be adjusted to be identical to the timings of the auxiliary ADC 41j. Thus, the timings of the main clocks CLK1 to CLKk may be aligned to the timings of the auxiliary ADC 41j.

The timing error detector 471 may detect a timing error between the auxiliary clock CLKasj and each of the main clocks CLK1 to CLKk. To detect timing errors, the timing error detector 471 may refer to a first bit (e.g., the most significant bit) and a second bit (e.g., a bit adjacent to the most significant bit and lower than the most significant bit) of each of the second bit strings DD1 to DDk.

When a value of the first bit of one bit string among the second bit strings DD1 to DDk is identical to a value of the second bit of the one bit string, the timing error detector 471 may output the detection value DT indicating a timing error. For example, when the value of the first bit of the second bit string DD1 is identical to the value of the second bit of the second bit string DD1, the timing error detector 471 may output the detection value DT indicating a timing error between the auxiliary clock CLKasj and the main clock CLK1.

The slope calculator 473 may generate the slope value SS. The slope value SS may be obtained based on a difference between the following output data of the following timing and the preceding output data of the preceding timing.

The delay calibrator 475 may output the delay calibration value DC. The delay calibrator 475 may generate the delay calibration value DC based on the first bit (e.g., the most significant bit) of each of the second bit strings DD1 to DDk and the slope value SS. The delay calibration value DC may be referenced to adjust the delay times of the delay circuits 491 to 49k. The delay calibration value DC may adjust a delay time of a delay circuit that outputs a main clock associated with the timing error.

The different delay times of the delay circuits 491 to 49k may be adjusted such that the different timings of the main clocks CLK1 to CLKk are adjusted. Herein, the delay times of the delay circuits 491 to 49k may be adjusted independently based on the slope value SS (i.e., the direction in which the level of the input signal is changed) and the second bits of the second bit strings DD1 to DDk.

Meanwhile, in some example embodiments, for each cycle of the auxiliary clocks CLKas1 to CLKasj and the main clocks CLK1 to CLKk, a timing of a different auxiliary clock may correspond to a timing of a different main clock. In some example embodiments, the ADC circuit 400 may be implemented such that the number of auxiliary ADCs 411 to 41j and the number of main ADCs 421 to 42k are relatively prime.

In the above example embodiments, for different cycles of the auxiliary clocks CLKas1 to CLKasj and the main clocks CLK1 to CLKk, each of the timings of the auxiliary clocks CLKas1 to CLKasj may correspond once to each and every one of the timings of the main clocks CLK1 to CLKk. This will be further described with reference to FIGS. 20 and 21.

Thus, the timings of the auxiliary clock CLKasj provided as the reference clock CLKref may correspond to each and every one of the timings of the main clocks CLK1 to CLKk, and the timings of the main clocks CLK1 to CLKk may be aligned with the timings of the auxiliary clock CLKasj. As a result, the timing error may be resolved, and skew mismatch between the time-interleaved main clocks CLK1 to CLKk may be resolved.

Figure 20:
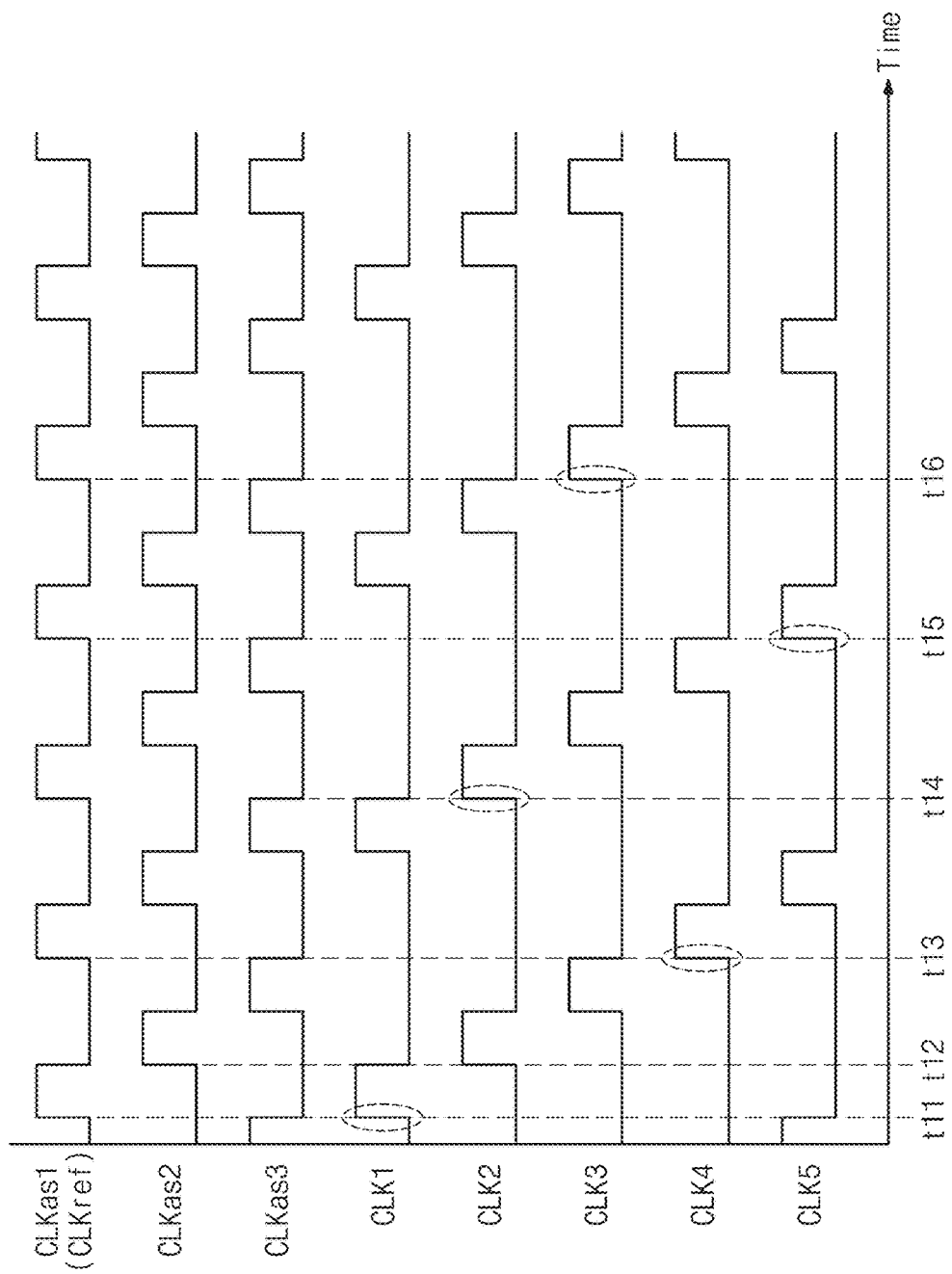
FIG. 20 is a timing diagram illustrating example clocks handled in an ADC circuit of FIG. 19.
Figure 21:
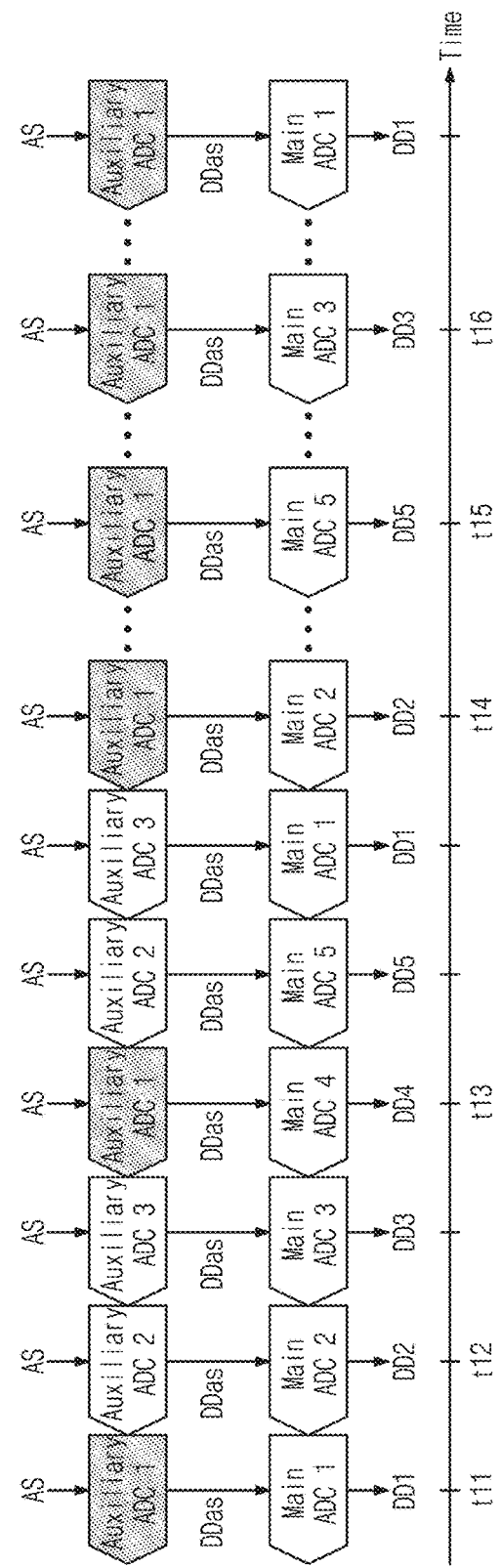
FIG. 21 is a conceptual diagram for describing an example operation of an ADC circuit of FIG. 19.

FIG. 20 is a timing diagram illustrating example clocks handled in the ADC circuit 400 of FIG. 19. FIG. 21 is a conceptual diagram for describing an example operation of the ADC circuit 400 of FIG. 19.

For example, FIGS. 20 and 21 are associated with a case where three auxiliary ADCs and five main ADCs are employed. In this example, the number of auxiliary ADCs and the number of main ADCs are relatively prime. Auxiliary clocks CLKas1 to CLKas3 may be employed for the three auxiliary ADCs, and main clocks CLK1 to CLK5 may be employed for the five main ADCs. For example, the auxiliary clock CLKas1 may be provided as the reference clock CLKref, and the auxiliary ADC outputting the auxiliary clock CLKas1 may be selected as the reference ADC.

Referring to FIG. 20, for each cycle of the auxiliary clocks CLKas1 to CLKas3 and the main clocks CLK1 to CLK5, a timing of a different auxiliary clock may correspond to a timing of a different main clock. For example, at time t11, the timing of the auxiliary clock CLKas1 may correspond to the timing of the main clock CLK1, and at time t12, the timing of the auxiliary clock CLKas2 may correspond to the timing of the main clock CLK2. In such a manner, the timings of each and every one of the auxiliary clocks CLKas1 to CLKas3 may correspond once to the timings of each and every one of the main clocks CLK1 to CLK5.

Thus, each of the timings of one auxiliary clock may correspond once to each and every one of the main clocks CLK1 to CLK5. For example, each of the timings of the auxiliary clock CLKas1 provided as the reference clock CLKref may correspond once to each and every one of the timings of the main clocks CLK1 to CLK5. For example, at time t11, the timing of the auxiliary clock CLKas1 may correspond to the timing of the main clock CLK1. Further, at time t13 to time t16, the timings of the auxiliary clock CLKas1 may correspond to the timings of the main clocks CLK2 to CLK5.

Referring to FIG. 21, each and every one of the timings at which the auxiliary ADCs operate may be associated once with each and every one of the timings at which the main ADCs operate. For example, at time t11, the first auxiliary ADC may convert the analog signal AS to the first bit string DDas, and the first main ADC may convert the analog signal AS to the second bit string DD1 based on the first bit string DDas. On the other hand, at time t12, the second auxiliary ADC may convert the analog signal AS to the first bit string DDas, and the second main ADC may convert the analog signal AS to the second bit string DD2 based on the first bit string DDas.

On the other hand, each of the timings at which the first auxiliary ADC selected as the reference ADC operates may be associated once with each and every one of the timings at which the main ADCs operate. For example, while the first auxiliary ADC operates at time t13 to time t16, the second to fifth main ADCs may operate respectively at time t13 to time t16. Thus, the timings of the main clocks CLK1 to CLK5 may be aligned to the timings of the auxiliary clock CLKas1.

Figure 22:
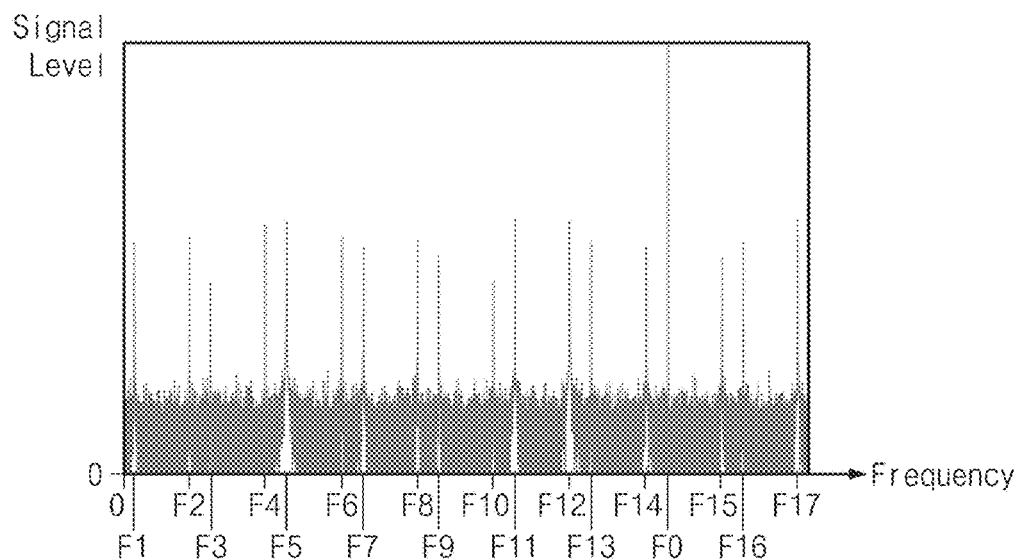
FIGS. 22 and 23 are graphs illustrating results of an example simulation in which timings of main clocks are adjusted in an ADC circuit of FIG. 19.
Figure 23:
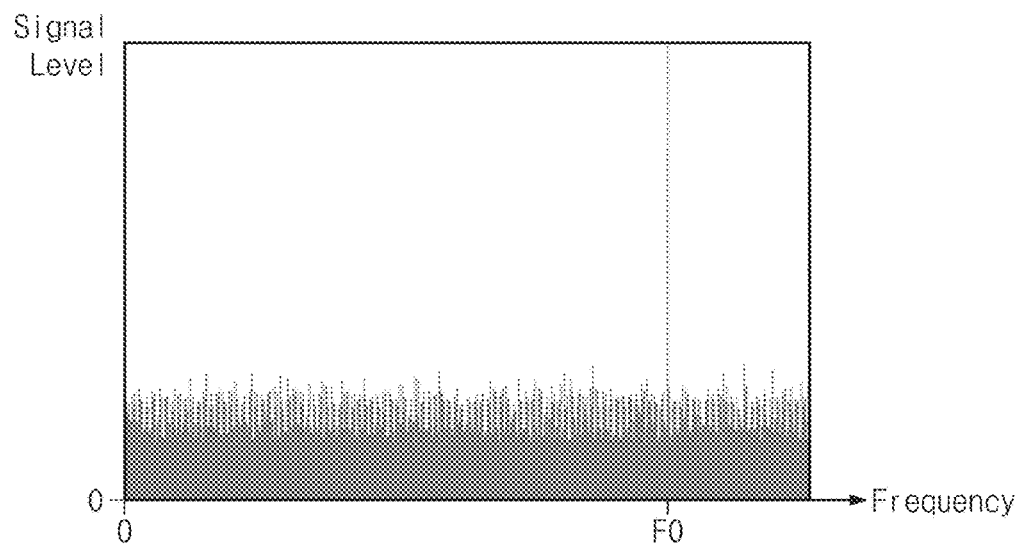

FIGS. 22 and 23 are graphs illustrating results of an example simulation in which the timings of the main clocks are adjusted in the ADC circuit 400 of FIG. 19. For example, FIGS. 22 and 23 illustrate results of a simulation performed under a condition in which five auxiliary ADCs, five auxiliary clocks, eighteen (18) main ADCs, and eighteen main clocks are employed. Under this condition, the number of auxiliary ADCs and the number of main ADCs are relatively prime.

FIG. 22 illustrates signal levels of outputs obtained before the timings of the main clocks are adjusted, and FIG. 23 illustrates the signal levels of the outputs obtained after the timings of the main clocks are adjusted. Referring to FIGS. 22 and 23, a frequency F0 may correspond to a clock frequency that is intended to operate the ADC circuit 400. On the other hand, frequencies F1 to F17 may be associated with outputs (i.e., noise components) obtained due to the timing error.

Comparing FIG. 23 with FIG. 22, it may be understood that the outputs of the frequencies F1 to F17 due to the timing error are eliminated as the timings of the main clocks are adjusted. In the simulation condition of FIG. 22, SFDR was 49.24 dB, SNDR was 39.33 dB, and ENOB was 6.24 bits. On the other hand, in the simulation condition of FIG. 23, SFDR was 84.73 dB, SNDR was 62.24 dB, and ENOB was 10.04 bits.

Referring to the above results, as the timings of the main clocks are adjusted, the timings of the main clocks may be aligned to the timings of the auxiliary clock selected as the reference clock, and thus timing errors and skew mismatch may be resolved. That is, it may be understood that example embodiments of the present disclosure are useful to accurately control a plurality of clocks.

Figure 24:
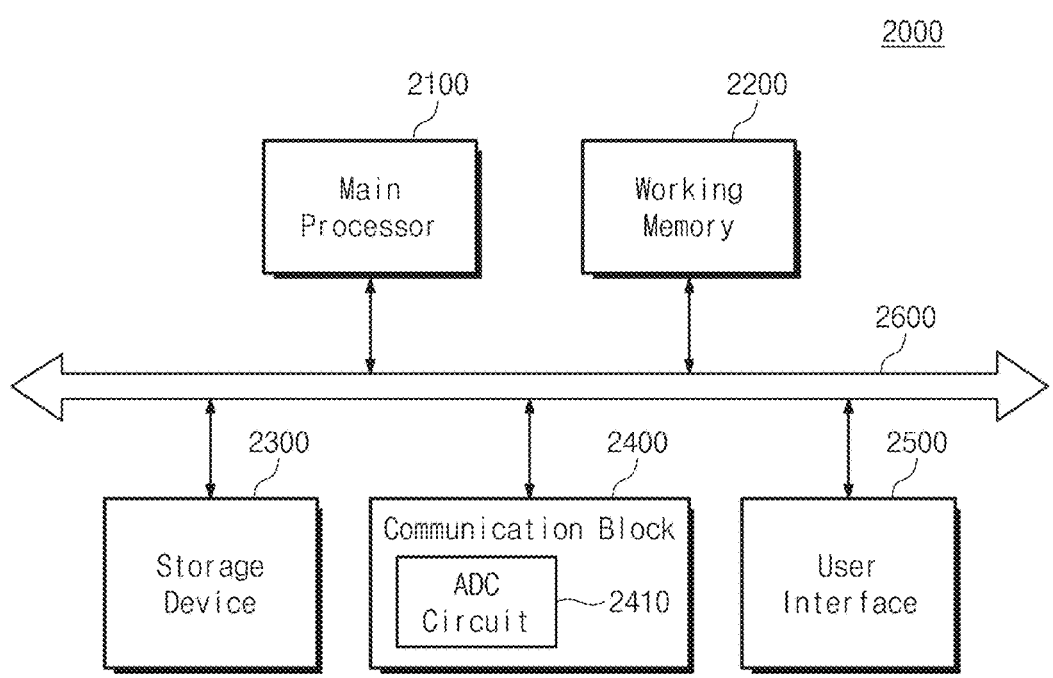
FIG. 24 is a block diagram illustrating an example configuration of an electronic system which employs an ADC circuit according to some example embodiments.

FIG. 24 is a block diagram illustrating an example configuration of an electronic system 2000 which employs an ADC circuit according to some example embodiments.

The electronic system 2000 may include a main processor 2100, a working memory 2200, a storage device 2300, a communication block 2400, a user interface 2500, and a bus 2600. For example, the electronic device 2000 may be one of electronic devices such as a desktop computer, a laptop computer, a tablet computer, a smart phone, a wearable device, an electric vehicle, a workstation, a server, and/or the like.

The main processor 2100 may control the overall operations of the electronic system 2000. The main processor 2100 may process various kinds of arithmetic and/or logical operations. For example, the main processor 2100 may be implemented with a general purpose processor, a dedicated processor, or an application processor.

The working memory 2200 may store data used in the operation of the electronic system 2000. For example, the working memory 2200 may temporarily store data processed or to be processed by the main processor 2100. For example, the working memory 2200 may include a volatile memory such as a dynamic random access memory (DRAM), a synchronous DRAM (SDRAM), and the like, and/or a nonvolatile memory such as a phase-change RAM (PRAM), a magneto-resistive RAM (MRAM), a resistive RAM (ReRAM), a ferro-electric RAM (FRAM), and the like.

A memory device of the storage device 2300 may store data regardless of power supply. For example, the storage device 2300 may include a nonvolatile memory such as a flash memory, a PRAM, an MRAM, a ReRAM, an FRAM, and the like. For example, the storage device 2300 may include storage media such as a hard disk drive (HDD), a solid state drive (SSD), a card storage, an embedded storage, and the like.

The communication block 2400 may communicate with an external device/system of the electronic system 2000. The communication block 2400 may be a component capable of providing communication services, such as a modulator/demodulator (MODEM) chip or device, a network card, a communication switch, a hub, a router, and/or the like. For example, the communication block 2400 may support at least one of a variety of wireless communication protocols such as LTE, WIMAX, GSM, CDMA, Bluetooth, near field communication (NFC), Wi-Fi, RFID, and the like, and/or at least one of various wired communication protocols such as TCP/IP, USB, Firewire, and the like.

The communication block 2400 may include various electronic circuits such as a transmission circuit, a reception circuit, an ADC circuit 2410, a CDR circuit, and/or the like, to provide communication services. The ADC circuit 2410 may adjust timings of a plurality of clocks according to the example embodiments of the present disclosure. To this end, the ADC circuit 2410 may be implemented according to the example embodiments described with reference to FIGS. 1 to 16 and FIGS. 19 to 21 and various other example embodiments modified from the example embodiments.

The user interface 2500 may arbitrate in communication between a user and the electronic system 2000. For example, the user interface 2500 may include an input interface such as a keyboard, a mouse, a keypad, a button, a touch panel, a touch screen, a touch pad, a touch ball, a camera, a microphone, a gyroscope sensor, a vibration sensor, and/or the like. For example, the user interface 2500 may include an output interface such as a liquid crystal display (LCD) device, a light emitting diode (LED) display device, an organic LED (OLED) display device, an active matrix OLED (AMOLED) display device, a speaker, a motor, and/or the like.

The bus 2600 may provide a communication path between components of the electronic system 2000. The components of the electronic system 2000 may exchange data with each other based on a bus format of the bus 2600. For example, the bus format may include at least one of various interface protocols such as USB, small computer system interface (SCSI), peripheral component interconnect express (PCIe), mobile PCIe (M-PCIe), advanced technology attachment(ATA), parallel ATA (PATA), serial ATA (SATA), serial attached SCSI (SAS), integrated drive electronics (IDE), enhanced IDE (EIDE), nonvolatile memory express (NVMe), universal flash storage (UFS), and/or the like.

Meanwhile, the above descriptions have been provided to describe an ADC circuit employed with regard to communications, but the present disclosure is not limited to the above descriptions. The ADC circuit according to example embodiments of the present disclosure may be employed in any type of electronic device/circuit. Further, example embodiments of the present disclosure may be employed in another type of electronic circuit other than an ADC circuit. Example embodiments of the present disclosure may be employed in any type of electronic circuit operating based on a plurality of clocks.

The configuration illustrated in each block diagram is provided to facilitate better understanding. Each block may be implemented in smaller units of blocks depending on its function. Alternatively, a plurality of blocks may be implemented in a larger unit of block depending on their functions. The present disclosure is not limited to the configuration illustrated in each block diagram.

In the above, the present disclosure has been described based on some example embodiments. However, due to the nature of the technical field to which the present disclosure belongs, the purpose and the effect of the present disclosure may be achieved by other implementations which are different from the above example embodiments but include the subject matters of the present disclosure. Accordingly, the above example embodiments should be understood in a descriptive sense, not in a limited perspective sense. That is, implementations, that may achieve the same purpose and the effect as those of the above example embodiments while including the subject matters of the present disclosure, should be construed as being covered by the scope of protection claimed below.

Accordingly, implementations that are altered or modified without departing from characteristics of the present disclosure will fall within the scope of protection claimed below. Also, it should be understood that the scope of protection of the present disclosure is not limited to the above example embodiments, but covers the technical concepts which is read from the following claims.

What is claimed is:

1. An electronic circuit comprising:
   a reference analog-to-digital converter (ADC) to convert an input signal to a first bit string of output data, in response to a reference clock;
   a delay circuit to delay a source clock by a delay time to output a main clock; and
   a main ADC to convert the input signal to a second bit string of the output data, in response to the main clock, wherein
   when a value of a first bit included in the second bit string is identical to a value of a second bit included in the second bit string, the delay time is adjusted based on a direction in which a level of the input signal is changed and the value of the first bit.

2. The electronic circuit of claim 1, wherein
   the first bit string comprises upper bits of the output data, and
   the second bit string comprises lower bits other than the upper bits of the output data.

3. The electronic circuit of claim 1, wherein
   the first bit comprises a most significant bit of the second bit string, and
   the second bit comprises a bit that is adjacent to the most significant bit of the second bit string and is lower than the most significant bit.

4. The electronic circuit of claim 1, wherein
   the output data is generated corresponding to first timings associated with the reference clock and the main clock, and
   the direction in which the level of the input signal is changed is obtained based on a difference between following output data and preceding output data, the following output data being generated corresponding to second timings immediately after the first timings, the preceding output data being generated corresponding to third timings immediately before the first timings.

5. The electronic circuit of claim 1, wherein
   when a timing of the reference clock is different from a timing of the main clock, the value of the first bit is identical to the value of the second bit.

6. The electronic circuit of claim 1, wherein
   as the delay time increases or decreases, timings of the main clock are delayed or advanced.

7. The electronic circuit of claim 1, wherein
   when the first bit has a first logic value and the level of the input signal increases, timings of the main clock are delayed as the delay time is adjusted, and
   when the first bit has a second logic value and the level of the input signal increases, the timings of the main clock are advanced as the delay time is adjusted.

8. The electronic circuit of claim 1, wherein
   when the first bit has a first logic value and the level of the input signal decreases, timings of the main clock are advanced as the delay time is adjusted, and when the first bit has a second logic value and the level of the input signal decreases, the timings of the main clock are delayed as the delay time is adjusted.

9. The electronic circuit of claim 1, wherein
the output data is generated corresponding to first timings associated with the reference clock and the main clock, and
the electronic circuit further comprises:
a slope calculator to output a slope value indicating the direction in which the level of the input signal is changed, based on a difference between following output data and preceding output data, the following output data being generated corresponding to second timings immediately after the first timings, preceding output data being generated corresponding to third timings immediately before the first timings; and
a delay calibrator to output a delay calibration value based on the value of the first bit and the slope value, such that the delay time is adjusted.

10. The electronic circuit of claim 9, wherein
when the first bit has a first logic value and the slope value has the first logic value, the delay time increases based on the delay calibration value,
when the first bit has a second logic value and the slope value has the first logic value, the delay time decreases based on the delay calibration value, and
when the first bit has the first logic value and the slope value has the second logic value, the delay time decreases based on the delay calibration value.

11. The electronic circuit of claim 9, further comprising an accumulator to accumulate delay calibration values output from the delay calibrator, to output a final calibration value, wherein
the delay time increases or decreases based on the final calibration value.

12. The electronic circuit of claim 11, wherein
the accumulator is to accumulate the delay calibration values output from the delay calibrator, for a reference time duration or until a reference number of delay calibration values are accumulated.

13. The electronic circuit of claim 9, further comprising a timing error detector to output a detection value indicating that a timing of the reference clock is different from a timing of the main clock, based on the first bit and the second bit, wherein
the slope calculator and the delay calibrator are to be activated in response to the detection value, and to be deactivated when the detection value is not output.

14. The electronic circuit of claim 1, wherein
as the delay time is adjusted, a timing of the main clock is adjusted to be identical to a timing of the reference clock.

15. An electronic circuit comprising:
a reference analog-to-digital converter (ADC) to convert an input signal to first bit strings of a plurality of output data, in response to a reference clock;
a plurality of delay circuits to delay a source clock by different delay times to output a plurality of main clocks providing different timings; and
a plurality of main ADCs to convert the input signal to second bit strings of the plurality of output data, in response to the plurality of main clocks, wherein when a value of a first bit included in one second bit string among the second bit strings is identical to a value of a second bit included in the one second bit string, a timing of a main clock, among the plurality of main clocks, associated with output data, among the plurality of output data, corresponding to the one second bit string is adjusted based on a direction in which a level of the input signal is changed and the value of the first bit.

16. The electronic circuit of claim 15, wherein
the plurality of main clocks is time-interleaved such that the input signal is sampled successively at each of the different timings, and
a timing of the reference clock corresponds to a timing of a different main clock for each cycle of the reference clock.

17. The electronic circuit of claim 15, wherein
the different delay times of the plurality of delay circuits are adjusted such that the different timings of the plurality of main clocks are adjusted, and
the different delay times of the plurality of delay circuits are independently adjusted based on the direction in which the level of the input signal is changed and values of first bits respectively included in the second bit strings.

18. An electronic circuit comprising:
a plurality of auxiliary analog-to-digital converters (ADC) to convert an input signal to first bit strings of a plurality of output data, in response to a plurality of auxiliary clocks providing different first timings; and
a plurality of main ADCs to convert the input signal to second bit strings of the plurality of output data, in response to a plurality of main clocks providing different second timings, wherein
when a value of a first bit included in one second bit string among the second bit strings is identical to a value of a second bit included in the one second bit string, a timing of a main clock, among the plurality of main clocks, associated with output data, among the plurality of output data, corresponding to the one second bit string is adjusted based on a direction in which a level of the input signal is changed and the value of the first bit, and
the plurality of auxiliary clocks is time-interleaved, the plurality of main clocks is time-interleaved, and a timing of a different auxiliary clock corresponds to a timing of a different main clock for each cycle of the plurality of auxiliary clocks and the plurality of main clocks.

19. The electronic circuit of claim 18, wherein
as the different second timings of the plurality of main clocks are adjusted, the different second timings of the plurality of main clocks are aligned to be identical to first timings for one auxiliary ADC selected from the plurality of auxiliary ADCs.

20. The electronic circuit of claim 18, wherein
a number of the plurality of auxiliary ADCs and a number of the plurality of main ADCs are relatively prime, and
for different cycles of the plurality of auxiliary clocks and the plurality of main clocks, each of the different first timings corresponds once to each and every one of the different second timings.

* * * * *